US012249286B2

(12) United States Patent
Hwang et al.

(10) Patent No.: US 12,249,286 B2
(45) Date of Patent: Mar. 11, 2025

(54) DISPLAY DEVICE AND DRIVING METHOD

(71) Applicant: LG Display Co., Ltd., Seoul (KR)

(72) Inventors: Insu Hwang, Seoul (KR); DongYoon Lee, Seoul (KR); Kimin Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/543,637

(22) Filed: Dec. 18, 2023

(65) Prior Publication Data

US 2024/0221673 A1    Jul. 4, 2024

(30) Foreign Application Priority Data

Dec. 30, 2022   (KR) ........................ 10-2022-0190651

(51) Int. Cl.
*G09G 3/3258*   (2016.01)
*H10K 59/131*   (2023.01)

(52) U.S. Cl.
CPC ......... *G09G 3/3258* (2013.01); *H10K 59/131* (2023.02); *G09G 2300/0426* (2013.01);
(Continued)

(58) Field of Classification Search
CPC ......... G09G 3/3258; G09G 2300/0426; G09G 2300/0819; G09G 2300/0842;
(Continued)

(56) References Cited

U.S. PATENT DOCUMENTS 8,284,155 B2    10/2012   Lee et al.
9,377,645 B2     6/2016   Lee et al.
(Continued)

FOREIGN PATENT DOCUMENTS

CN    114902319 A    8/2022
JP    2008-165181 A   7/2008
(Continued)

OTHER PUBLICATIONS

Taiwan Intellectual Property Office, Office Action, Taiwanese Patent Application No. 112149816, Sep. 20, 2024, 12 pages.
(Continued)

*Primary Examiner* — Amy Onyekaba
(74) *Attorney, Agent, or Firm* — Fenwick & West LLP

(57) ABSTRACT

A display device is disclosed. The display device comprises: a driving transistor drives a light emitting element; a scanning transistor connected between a first node of the driving transistor and a data line; and a sensing transistor connected between a second node of the driving transistor and a reference voltage line, wherein a period of time during which a characteristic value of the sensing transistor is sensed includes a voltage control period, a voltage tracking period, and a sampling period, and during the voltage control period, a first sensing voltage is supplied to the data line, a second sensing voltage is supplied to a third node of the driving transistor, a third sensing voltage is supplied to gate nodes of the scanning transistor and the sensing transistor, and a fourth sensing voltage is supplied to the reference voltage line. Accordingly, changes of characteristic values of the sensing transistor are sensed.

19 Claims, 13 Drawing Sheets

(52) U.S. Cl.
CPC ............... *G09G 2300/0819* (2013.01); *G09G 2300/0842* (2013.01); *G09G 2310/08* (2013.01); *G09G 2320/0233* (2013.01); *G09G 2330/021* (2013.01)

(58) Field of Classification Search
CPC ....... G09G 2310/08; G09G 2320/0233; G09G 2330/021; G09G 3/3233; H10K 59/131
See application file for complete search history.

(56) References Cited

U.S. PATENT DOCUMENTS

| | | | |
|---|---|---|---|
| 9,576,530 B2 | 2/2017 | Kanda et al. | |
| 10,262,588 B2 | 4/2019 | Yoon et al. | |
| 10,971,081 B2 | 4/2021 | Kang et al. | |
| 11,501,695 B2 | 11/2022 | Yamazaki et al. | |
| 11,783,784 B2 * | 10/2023 | Lee | G09G 3/3291 345/204 |
| 11,830,417 B2 * | 11/2023 | Im | G09G 3/32 |
| 11,869,417 B2 | 1/2024 | Yamazaki et al. | |
| 11,869,447 B2 | 1/2024 | Yoo et al. | |
| 11,922,839 B2 | 3/2024 | Lee | |
| 12,165,575 B2 | 12/2024 | Yamazaki et al. | |
| 2008/0158199 A1 | 7/2008 | Lee et al. | |
| 2012/0188190 A1 | 7/2012 | Lee et al. | |
| 2015/0054722 A1 | 2/2015 | Kanda et al. | |
| 2015/0170571 A1 | 6/2015 | Park et al. | |
| 2017/0193899 A1 * | 7/2017 | Yoon | G09G 3/3233 |
| 2020/0043421 A1 | 2/2020 | Kang et al. | |
| 2020/0160781 A1 * | 5/2020 | Park | G09G 3/3275 |
| 2021/0012692 A1 | 1/2021 | Wang et al. | |
| 2021/0193029 A1 | 6/2021 | Yamazaki et al. | |
| 2022/0109039 A1 * | 4/2022 | Jeon | H10K 59/80522 |
| 2022/0122512 A1 * | 4/2022 | Lee | G09G 3/3233 |
| 2022/0157261 A1 * | 5/2022 | Kim | G09G 3/3233 |
| 2022/0189356 A1 * | 6/2022 | Hong | G09G 3/3275 |
| 2022/0208129 A1 | 6/2022 | Yoo et al. | |
| 2022/0392991 A1 * | 12/2022 | Woo | H10K 59/65 |
| 2023/0014815 A1 * | 1/2023 | Lee | G09G 3/006 |
| 2023/0046927 A1 | 2/2023 | Yamazaki et al. | |
| 2023/0063319 A1 * | 3/2023 | Kim | G09G 3/20 |
| 2024/0046857 A1 | 2/2024 | Yamazaki et al. | |
| 2024/0046870 A1 * | 2/2024 | Chung | G09G 3/3233 |
| 2024/0054932 A1 * | 2/2024 | Hu | H10K 50/125 |
| 2024/0071313 A1 * | 2/2024 | Pyun | G09G 3/3266 |
| 2024/0112630 A1 * | 4/2024 | Bae | G09G 3/3233 |

FOREIGN PATENT DOCUMENTS

| | | |
|---|---|---|
| JP | 2015-043041 A | 3/2015 |
| JP | 2020-024413 A | 2/2020 |
| JP | WO2020/053701 A1 | 9/2021 |
| JP | 2022-105319 A | 7/2022 |
| KR | 10-2017-0073364 A | 6/2017 |
| TW | 201727962 A | 8/2017 |

OTHER PUBLICATIONS

The Japan Patent Office, Office Action, Japanese Patent Application No. 2023-216251, Jan. 5, 2025, 14 pages.

* cited by examiner

FIG.3
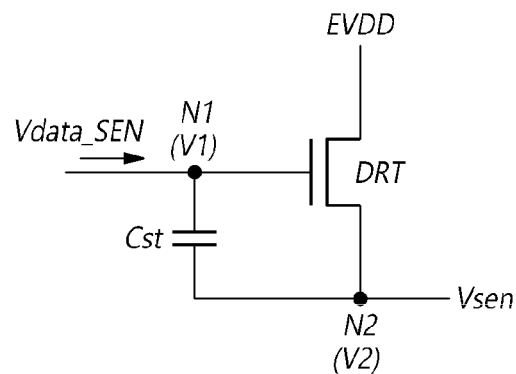
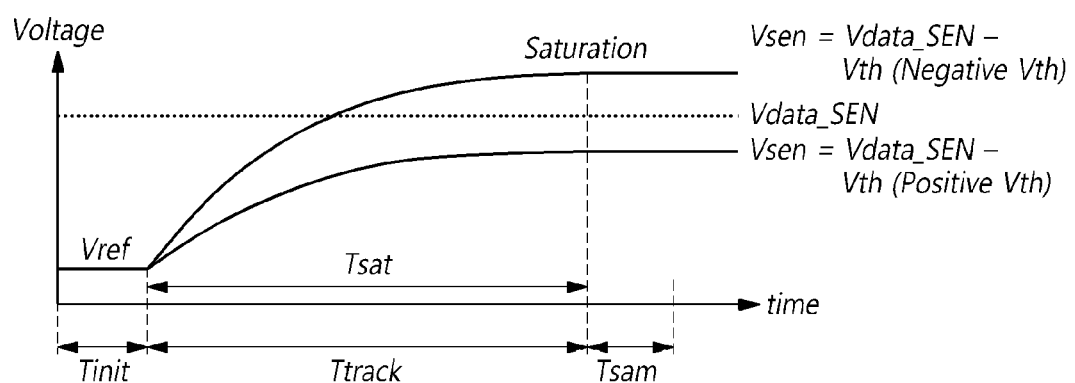

DISPLAY DEVICE AND DRIVING METHOD

CROSS-REFERENCE TO RELATED APPLICATION

This application claims priority from Republic of Korea Patent Application No. 10-2022-0190651, filed on Dec. 30, 2022, which is hereby incorporated by reference in its entirety.

BACKGROUND

Field of the Invention

Embodiments of the present disclosure relate to a display device and a driving method.

Description of Related Art

In accordance with development of the information society, requests for display devices used for displaying videos have increased in various forms, and, recently, various display devices such as a liquid crystal display device and an organic light emitting display device are used.

For video display, a display device may include a display panel in which multiple data lines, multiple gate lines, and multiple subpixels are disposed, a data driving circuit outputting data signals to multiple data lines, a gate driving circuit outputting scanning signals to multiple gate lines, and the like.

A subpixel may include a light emitting element, a driving transistor, a scanning transistor, a sensing transistor, and a storage capacitor.

SUMMARY

In a case in which a display device is driven for a long time, characteristics values of a transistor may vary.

The characteristic values of a driving transistor may be compensated using various compensation technologies.

On the other hand, characteristic values of a sensing transistor may also vary in a case in which a display device is driven for a long time.

However, the method for compensating for the characteristic values of the driving transistor cannot be simply applied to the sensing transistor, there is a problem in that the characteristic values of the sensing transistor cannot be compensated.

Embodiments of the present disclosure can provide a display device and a driving method capable of sensing changes in characteristic values of a sensing transistor.

The embodiments of the present disclosure can provide a display device and a driving method capable of sensing changes in characteristics values of a transistor adjacent to an opening part.

The embodiments of the present disclosure can provide a display device and a driving method capable of implementing low power consumption in accordance with sensing of changes in characteristic values of a transistor adjacent to an opening part.

In one embodiment, a display device comprises: a light emitting element configured to emit light: a driving transistor including a gate electrode at a first node, a first electrode connected to a third node, and a second electrode connected to the light emitting element at a second node, the driving transistor configured to drive the light emitting element: a scanning transistor electrically connected between the gate electrode of the driving transistor at the first node and a data line, the scanning transistor including a gate electrode: and a sensing transistor electrically connected between the second electrode of the driving transistor at the second node and a reference voltage line, the sensing transistor including a gate electrode; wherein a period during which a characteristic value of the sensing transistor is sensed includes a voltage control period, a voltage tracking period after the voltage control period, and a sampling period after the voltage tracking period, and during the voltage control period, a first sensing voltage is supplied to the data line, a second sensing voltage is supplied to the first electrode of the driving transistor at the third node, a third sensing voltage is supplied to the gate electrode of the scanning transistor and the gate electrode of the sensing transistor, and a fourth sensing voltage is supplied to the reference voltage line.

In one embodiment, a driving method for a display device comprises: controlling a voltage supplied to a subpixel, the subpixel including: a light emitting element configured to emit light: a driving transistor including a gate electrode at a first node, a drain electrode connected to a third node, and a source electrode connected to the light emitting element at a second node, the driving transistor configured to drive the light emitting element: a scanning transistor electrically connected between the gate electrode of the driving transistor at the first node and a data line, the scanning transistor including a gate electrode, a drain electrode, and a source electrode; and a sensing transistor electrically connected between the source electrode of the driving transistor at the second node and a reference voltage line, the sensing transistor including a gate electrode, a drain electrode, and a source electrode: tracking a voltage of the source electrode of the sensing transistor; and sensing the voltage of the source electrode of the sensing transistor, wherein, during the tracking of the voltage of the source electrode of the sensing transistor, a first sensing voltage is supplied to the drain electrode of the scanning transistor, a second sensing voltage is supplied to the drain electrode of the driving transistor, a third sensing voltage is supplied to the gate electrode of the scanning transistor and the gate electrode of the sensing transistor, and a fourth sensing voltage is supplied to the source electrode of the sensing transistor.

In one embodiment, a display device comprises: a light emitting element configured to emit light: a driving transistor including a gate electrode at a first node, a first electrode connected to a third node, and a second electrode connected to the light emitting element at a second node, the driving transistor configured to drive the light emitting element: a scanning transistor electrically connected between the gate electrode of the driving transistor at the first node and a data line, the scanning transistor including a gate electrode; and a sensing transistor electrically connected between the second electrode of the driving transistor at the second node and a reference voltage line, the sensing transistor including a gate electrode, wherein a characteristic of the sensing transistor is sensed during a sensing mode and a scan signal applied to the gate electrode of the sensing transistor is adjusted from a first voltage applied during the sensing mode to a second voltage that is less than the first voltage based on the sensed characteristic of the sensing transistor.

According to embodiments of the present disclosure, a display device and a driving method capable of sensing changes in characteristic values of a sensing transistor can be provided.

According to embodiments of the present disclosure, a display device and a driving method capable of sensing changes in characteristics values of a transistor adjacent to an opening part can be provided.

Embodiments of the present disclosure can provide a display device and a driving method capable of implementing low power consumption in accordance with sensing of changes in characteristic values of a transistor adjacent to an opening part.

BRIEF DESCRIPTION OF THE DRAWINGS

FIG. 3 is a diagram for describing sensing driving of a slow-mode of a display device according to embodiments of the present disclosure.

DETAILED DESCRIPTION

Figure 1:
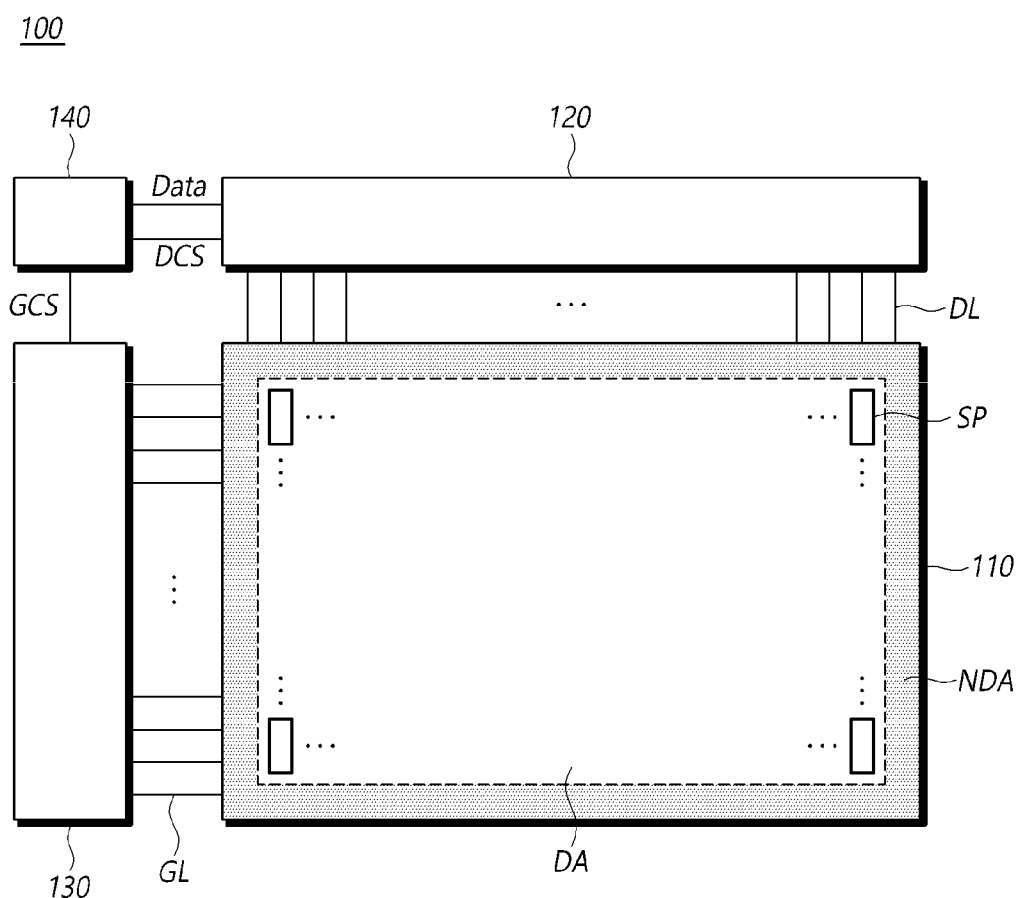
FIG. 1 is a system configuration diagram of a display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the attached drawings.

FIG. 1 is a system configuration diagram of a display 100 device according to embodiments of the present disclosure.

Referring to FIG. 1, the display device 100 according to embodiments of the present disclosure may include a display panel 110 and driving circuits used for driving the display panel 110.

The display panel 110 may include signal wirings such as multiple data lines DL and multiple gate lines GL and include multiple subpixels SP. The display panel 110 may include a display region DA in which a video or an image is displayed and a non-display region NDA in which no video or image is displayed. In the display panel 110, multiple subpixels SP used for displaying an image are disposed in the display region DA, and, in the non-display region NDA, driving circuits 120, 130, 140 may be electrically connected, or the driving circuits 120, 130, 140 may be mounted, and a pad part to which integrated circuits or printed circuits, and the like are connected may be disposed.

The driving circuits may include a data driving circuit 120, a gate driving circuit 130, and the like and further include a controller 140 that controls the data driving circuit 120 and the gate driving circuit 130.

The data driving circuit 120 is a circuit for driving multiple data lines DL and may supply data signals to multiple data lines DL. The gate driving circuit 130 is a circuit for driving multiple gate lines GL and may supply gate signals to the multiple gate lines GL.

The gate driving circuit 130 may output a gate signal of a turn-on level voltage or output a gate signal of a turn-off level voltage in accordance with control of the controller 140. The gate driving circuit 130 may sequentially drive multiple gate lines GL by sequentially supplying gate signals of the turn-on level voltage to the multiple gate lines GL.

In order to control an operation timing of the data driving circuit 120, the controller 140 may supply a data control signal DCS to the data driving circuit 120. The controller 140 may supply a gate control signal GCS used for controlling an operation timing of the gate driving circuit 130 to the gate driving circuit 130.

The controller 140 may start scanning in accordance with a timing implemented in each frame, convert input video data input from the outside in accordance with a data signal format used by the data driving circuit 120, supply converted video data Data to the data driving circuit 120, and control data driving at an appropriate time according to scanning.

In order to control the data driving circuit 120 and the gate driving circuit 130, the controller 140 receives timing signals such as a vertical synchronization signal Vsync, a horizontal synchronization signal Hsync, an input data enable signal DE, and a clock signal CLK as inputs, generates various control signals DCS, GCS, and outputs the generated control signals to the data driving circuit 120 and the gate driving circuit 130.

The controller 140 may be implemented using a component that is separate from the data driving circuit 120 or may be integrated with the data driving circuit 120 and implemented as an integrated circuit.

The data driving circuit 120 receives video data Data from the controller 140 as an input and supplies data voltages to multiple data lines DL, thereby driving the multiple data lines DL. Here, the data driving circuit 120 is also referred to as a source driving circuit. Such a data driving circuit 120 may include one or more source driver integrated circuits (SDIC). Each source driver integrated circuit (SDIC) may include a shift register, a latch circuit, a digital to analog converter (DAC), an output buffer, and the like. Each source driver integrated circuit (SDIC) may further include an analog to digital converter (ADC) in some cases.

For example, each source driver integrated circuit SDIC may be connected to the display panel 110 using a tape automated bonding TAB method, may be connected to a bonding pad of the display panel 110 using a chip on glass COG or chip on panel COP method, or may be implemented using a chip on film COF method and connected to the display panel 110.

The gate driving circuit 130 may be connected to the display panel 110 using a tape automated bonding TAB method, may be connected to a bonding pad of the display panel 110 using a chip on glass COG or chip on panel COP method, or may be connected to the display panel 110 using a chip on film COF method. Alternatively, the gate driving circuit 130 may be disposed in the non-display region NDA of the display panel 110 as a gate in panel GIP type.

When a specific gate line GL is open in accordance with the gate driving circuit 130, the data driving circuit 120 may convert video data Data received from the controller 140 into a data voltage of an analog form and supply the data voltage to multiple data lines DL.

The data driving circuit 120 may be connected to one side (for example, an upper side or a lower side) of the display panel 110. Depending on a driving type, a panel design type, and the like, the data driving circuit 120 may be connected to both sides (for example, an upper side and a lower side) of the display panel 110 or may be connected to two or more side faces among four side faces of the display panel 110.

The gate driving circuit 130 may be connected to one side (for example, a left side or a right side) of the display panel 110. Depending on a driving type, a panel design type, and the like, the gate driving circuit 130 may be connected to both sides (for example, a left side and a right side) of the display panel 110 or may be connected to two or more side faces among four side faces of the display panel 110.

The controller 140 may be a timing controller 140 used in a general display technology, may be a control device that includes a timing controller 140 and may further perform another control function, or may be a control device other than a timing controller 140, or may be a circuit disposed inside a control device. The controller 140 may be implemented using various circuits and electronic components such as an integrated circuit (IC), a field programmable gate array (FPGA), an application specific integrated circuit (ASIC), a processor, and the like.

The controller 140 is mounted in a printed circuit board, a flexible printed circuit, or the like and may be electrically connected to the data driving circuit 120 and the gate driving circuit 130 through the printed circuit board, the flexible printed circuit, or the like. The controller 140 may transmit/receive signals to/from the data driving circuit 120 in accordance with one or more interfaces set in advance. For example, the interface may include a low voltage differential signaling interface (LVDS), an EPI interface, a serial peripheral interface (SPI), and the like. The controller 140 may include storage places such as one or more registers.

A display device 100 according to embodiments of the present disclosure may be a self-emission display such as an organic light emitting diode (OLED) display, a quantum dot display, or a micro light emitting diode (LED) display.

Figure 2:
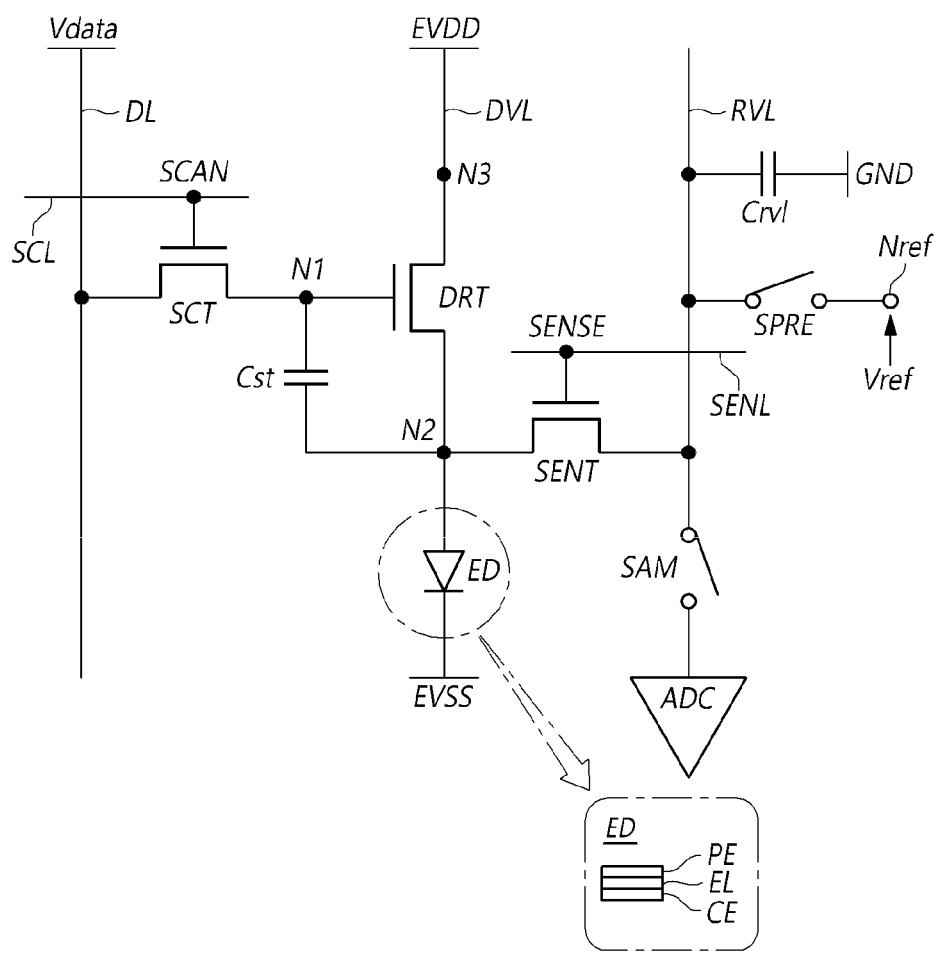
FIG. 2 is an equivalent circuit diagram of a subpixel of a display device according to embodiments of the present disclosure.

FIG. 2 is an equivalent circuit diagram of a subpixel SP of the display device 100 according to embodiments of the present disclosure.

Referring to FIG. 2, each of multiple subpixels SP disposed in the display panel 110 of the display device 100 according to embodiments of the present disclosure may include a light emitting element ED, a driving transistor DRT, a scanning transistor SCT, a sensing transistor SENT, a storage capacitor Cst, and the like. In this way, in a case in which a subpixel SP includes three transistors DRT, SCT, SENT and one capacitor Cst, it is referred to as the subpixel SP having a 3T (transistor) 1C (capacitor) structure.

The light emitting element ED may include a pixel electrode PE and a common electrode CE and may include a light emitting layer EL positioned between the pixel electrode PE and the common electrode CE. Here, the pixel electrode PE is disposed in each subpixel SP, and the common electrode CE may be disposed to be common to multiple subpixels SP. For example, the pixel electrode PE may be an anode electrode, and the common electrode CE may be a cathode electrode. As another example, the pixel electrode PE may be a cathode electrode, and the common electrode CE may be an anode electrode. For example, the light emitting element ED may be an organic light emitting diode (OLED), a micro light emitting diode (LED), a quantum dot light emitting element (ED), or the like.

The driving transistor DRT is a transistor used for driving a light emitting element ED and may include a first node N1, a second node N2, a third node N3, and the like.

The first node N1 of the driving transistor DRT may be a gate node of the driving transistor DRT, and may be electrically connected to a source node or a drain node of the scanning transistor SCT. The second node N2 of the driving transistor DRT may be a source node or a drain node of the driving transistor DRT, may be electrically connected to a source node or a drain node of the sensing transistor SENT and be electrically connected also to the pixel electrode PE of the light emitting element ED. A ground voltage EVSS is supplied to another end of the pixel electrode PE of the light emitting element ED through a ground voltage line SVL. The third node N3 of the driving transistor DRT may be electrically connected to a driving voltage line DVL that supplies a driving voltage EVDD.

The driving transistor may include a gate electrode of the first node, a first electrode of the third node, a first electrode of the second node, and a second electrode connected to the light emitting element of the second node.

The scanning transistor SCT is controlled in accordance with a scanning signal SCAN and may be connected between the first node N1 of the driving transistor DRT and the data line DL. The scanning transistor SCT is turned on or turned off in accordance with a scanning signal SCAN supplied from a scanning signal line SCL that is one type of gate line GL and can control connection between the data line DL and the first node N1 of the driving transistor DRT.

The scanning transistor SCT is turned on in accordance with a scanning gate signal SCAN having a turn-on level voltage and can transfer a data voltage Vdata supplied from the data line DL to the first node N1 of the driving transistor DRT.

A turn-on level voltage of the scanning signal SCAN that is able to turn on the scanning transistor SCT may be either a high-level voltage or a low-level voltage. A turn-off level voltage of the scanning signal SCAN that is able to turn off the scanning transistor SCT may be either a high-level voltage or a low-level voltage. For example, in a case in which the scanning transistor SCT is an n-type transistor, the turn-on level voltage may be a high-level voltage, and the turn-off level voltage may be a low-level voltage. As another example, in a case in which the scanning transistor SCT is a p-type transistor, the turn-on level voltage may be a low-level voltage, and the turn-off level voltage may be a high-level voltage.

The sensing transistor SENT is controlled in accordance with a sensing signal SENSE and may be connected between the second node N2 of the driving transistor DRT and a reference voltage line RVL. In other words, the sensing transistor SENT is turned on or turned off in accordance with a sensing signal SENSE supplied from a sensing signal line SENL that is another type of gate line GL and can control connection between the reference voltage line RVL and the second node N2 of the driving transistor DRT.

The sensing transistor SENT is turned on in accordance with a sensing signal SENSE having a turn-on level voltage and can transfer a reference voltage Vref supplied from the reference voltage line RVL to the second node N2 of the driving transistor DRT.

The turn-on level voltage of the sense signal SENSE that is able to turn on the sensing transistor SENT may be either a high-level voltage or a low-level voltage. The turn-off level voltage of the sense signal SENSE that is able to turn off the sensing transistor SENT may be either a high-level voltage or a low-level voltage. For example, in a case in which the sensing transistor SENT is an n-type transistor, the turn-on level voltage may be a high-level voltage, and the turn-off level voltage may be a low-level voltage. As another example, in a case in which the sensing transistor SENT is a p-type transistor, the turn-on level voltage may be a low-level voltage, and the turn-off level voltage may be a high-level voltage.

On the other hand, the display device 100 may further include a line capacitor Crvl formed between the reference voltage line RVL and the ground GND, a sampling switch SAM controlling connection between the reference voltage line RVL and the analog-to-digital converter ADC, and a power switch SPRE controlling connection between the reference voltage line RVL and a reference voltage supply node Nref. The reference voltage Vref output from a power supply device may be supplied to the reference voltage supply node Nref and be applied to the reference voltage line RVL through the power switch SPRE.

The sensing transistor SENT is turned on in accordance with a sensing signal SENSE having a turn-on level voltage and can transfer a voltage V2 of the second node N2 of the driving transistor DRT to the reference voltage line RVL. In accordance with this, the line capacitor Crvl formed between the reference voltage line RVL and the ground GND is able to be charged.

The function of the sensing transistor SENT for delivering the voltage V2 of the second node N2 of the driving transistor DRT to the reference voltage line RVL may be used at the time of driving for sensing characteristic values of the subpixel SP. In such a case, the voltage delivered to the reference voltage line RVL may be a voltage used for calculating characteristic values of the subpixel SP or a voltage in which the characteristic values of the subpixel SP are reflected.

In the present disclosure, characteristic values of a subpixel SP may be characteristic values of the driving transistor DRT or the light emitting element ED. The characteristic values of the driving transistor DRT may include a threshold voltage, mobility, and the like of the driving transistor DRT. The characteristic values of the light emitting element ED may include a threshold voltage of the light emitting element ED.

Each of the driving transistor DRT, the scanning transistor SCT, and the sensing transistor SENT may be either an n-type transistor or a p-type transistor. In the present disclosure, for convenience of description, a case in which each of the driving transistor DRT, the scanning transistor SCT, and the sensing transistor SENT is the n-type transistor will be described as an example.

The storage capacitor Cst may be connected between the first node N1 and the second node N2 of the driving transistor DRT. In the storage capacitor Cst, an electric charge amount corresponding to a voltage difference between both ends is charged, and the storage capacitor Cst has a role for maintaining a voltage difference between both the ends for a set frame time. In accordance with this, a corresponding subpixel SP can emit light for the set frame time.

The storage capacitor Cst may not be a parasitic capacitor (for example, Cgs or Cgd) that is an internal capacitor present between the gate node and the source node (or the drain node) of the driving transistor DRT, but an external capacitor that is intentionally designed outside the driving transistor DRT.

The scanning signal line SCL and the sensing signal line SENL may be mutually-different gate lines GL. In such a case, the scanning gate signal SCAN and the sensing gate signal SENSE may be individual gate signals, and an on-off timing of the scanning transistor SCT and an on-off timing of the sensing transistor SENT disposed inside one subpixel SP may be independent from each other. In other words, the on-off timing of the scanning transistor SCT and the on-off timing of the sensing transistor SENT inside one subpixel SP may be the same or be different from each other.

Differently from this, the scanning signal line SCL and the sensing signal line SENL may be the same gate line GL. In other words, a gate node of the scanning transistor SCT and a gate node of the sensing transistor SENT inside one subpixel SP may be connected to one gate line GL. In such a case, the scanning gate signal SCAN and the sensing gate signal SENSE may be the same gate signal, and the on-off timing of the scanning transistor SCT and the on-off timing of the sensing transistor SENT inside one subpixel SP may be the same.

On the other hand, the reference voltage line RVL may be disposed for every one subpixel SP column. Differently from this, the reference voltage line RVL may be disposed for every two or more subpixel SP columns. In a case in which the reference voltage line RVL is disposed for every two or more subpixel SP columns, a plurality of subpixels SP can receive supply of a reference voltage Vref from one reference voltage line RVL.

The driving transistors DRT included in multiple subpixels SP disposed in the display panel 110 of the display device 100 according to embodiments of the present disclosure may have intrinsic characteristic values. For example, intrinsic characteristic values of a driving transistor DRT may include a threshold voltage, mobility, and the like.

The characteristic values of a driving transistor DRT included in each of multiple subpixels SP may change in accordance with elapse of a driving time. All the driving times of the multiple subpixels SP are not the same. In other words, driving times of some of the multiple subpixels SP may be different from driving times of the remaining subpixels. In accordance with this, characteristic values of driving transistors DRT of some subpixels SP among the multiple subpixels SP may be different from characteristic values of driving transistors DRT of the other subpixels SP.

Due to deviations of characteristic values between the multiple driving transistors DRT disposed in the display panel 110, deviations of luminance between multiple subpixels SP disposed in the display panel 110 may occur. Thus, luminance non-uniformity of the display panel 110 may occur.

In accordance with this, the display device 100 according to embodiments of the present disclosure can provide a compensation function for sensing characteristic values of driving transistors DRT by performing sensing driving of subpixels SP of the display panel 110 and decreasing deviations of the characteristic values between the driving transistors DRT.

FIG. 3 is a diagram for describing sensing driving of a slow-mode (hereinafter, also referred to as "S-mode") of the display device 100 according to embodiments of the present disclosure.

Referring to FIG. 3, the S-mode is a mode in which a subpixel SP is driven for a long time for sensing characteristic values of a driving transistor DRT. The amount of time that the subpixel SP is driven during the S-mode is longer than the time that the subpixel SP is driven during a normal mode during which an image is displayed.

Referring to FIG. 3, a sensing driving period of the S-mode may include an initialization period Tinit, a tracking period Ttrack, and a sampling period Tsam.

Referring to FIG. 3, in the sensing driving period of the S-mode, the initialization period Tinit is a period in which the first node N1 and the second node N2 of the driving transistor DRT are initialized. During the initialization period Tinit, the scanning transistor SCT and the sensing transistor SENT may be turned on, and the power switch SPRE may be turned on.

During the initialization period Tinit, the voltage V1 of the first node N1 of the driving transistor DRT is initialized to a sensing driving data voltage Vdata_SEN, and the voltage V2 of the second node N2 of the driving transistor DRT is initialized to a sensing driving reference voltage Vref.

Referring to FIG. 3, during the sensing driving period of the S-mode, the tracking period Ttrack is a period in which the second voltage V2 of the second node N2 of the driving transistor DRT is boosted until the voltage V2 of the second node N2 of the driving transistor DRT reflects the characteristic values or changes of the characteristic values of the driving transistor DRT.

During the tracking period Ttrack, although the first node N1 of the driving transistor DRT is in a static voltage state having the sensing driving data voltage Vdata_SEN, the voltage V2 of the second node N2 of the driving transistor DRT may be saturated while rising.

When the tracking period Ttrack starts, a voltage difference between the first node N1 and the second node N2 of the driving transistor DRT initialized during the initialization period Tinit may be a threshold voltage Vth of the driving transistor DRT or more. In such a case, the driving transistor DRT is turned on and causes a current to flow therethrough. Here, in a case in which the first node N1 and the second node N2 of the driving transistor DRT are respectively a source node and a gate node, a voltage difference between the first node N1 and the second node N2 of the driving transistor DRT becomes Vgs. Thus, in a case in which the voltage difference Vgs between the first node N1 and the second node N2 of the driving transistor DRT is the threshold voltage Vth or more, when the tracking period Ttrack starts, the voltage V2 of the second node N2 of the driving transistor DRT may rise.

For example, a characteristic value of a driving transistor DRT may be the threshold voltage Vth of the driving transistor DRT. In such a case, until the voltage V2 of the second node N2 of the driving transistor DRT becomes the threshold voltage Vth or comes into a voltage state reflecting a change thereof, the voltage V2 of the second node N2 of the driving transistor DRT is changed in that step.

Thus, the tracking period Ttrack is a period in which the voltage V2 of the second node N2 of the driving transistor DRT that can reflect the threshold voltage Vth of the driving transistor DRT or a change thereof is tracked.

In the tracking period Ttrack, the power switch SPRE is turned off, or the sensing transistor SENT is turned off, and the second node N2 of the driving transistor DRT is floating. In accordance with this, the voltage V2 of the second node N2 of the driving transistor DRT rises. The voltage V2 of the second node N2 of the driving transistor DRT does not continuously rise but rises and then has an increase thereof decreasing and finally is saturated.

The saturated voltage V2 of the second node N2 of the driving transistor DRT may correspond to a difference (Vdata−Vth) between a data voltage Vdata and a threshold voltage Vth or a difference (Vdata−ΔVth) between the data voltage Vdata and a threshold voltage deviation ΔVth.

When the voltage V2 of the second node N2 of the driving transistor DRT is saturated, the sampling period Tsam may start. The sampling period Tsam is a period in which a voltage Vdata−Vth, Vdata−ΔVth in which the threshold voltage Vth of the driving transistor DRT or a change thereof is reflected is measured.

The sampling period Tsam in the sensing driving period of the S-mode is a period in which an analog-to-digital converter ADC connected to the reference voltage line RVL senses a voltage of the reference voltage line RVL. Here, the voltage of the reference voltage line RVL may correspond to the voltage V2 of the second node N2 of the driving transistor DRT and correspond to a charge voltage of the line capacitor Crvl formed in the reference voltage line RVL.

During the sampling period Tsam, a voltage V_sensing sensed by the analog-to-digital converter ADC may be a voltage (Vdata−Vth) acquired by subtracting a threshold voltage Vth from a data voltage Vdata or a voltage (Vdata−ΔVth) acquired by subtracting a threshold voltage deviation ΔVth from a data voltage Vdata. There, Vth may be either a positive threshold voltage or a negative threshold voltage.

During the tracking period Ttrack, a time Tsat required for the voltage V2 of the second node N2 of the driving transistor DRT to be saturated after rising is a time required for the threshold voltage Vth of the driving transistor DRT or a change thereof to be reflected in the voltage V2 (V2=Vdata−Vth) of the second node N2 of the driving transistor DRT and has a significant influence on an entire time length of the sensing driving period of the S-mode.

In the case of the S-mode, it takes quite a long time Tsat for the voltage V2 of the second node N2 of the driving transistor DRT to rise and be saturated. Thus, a sensing driving method in which the voltage V2 of the second node N2 of the driving transistor DRT is boosted and then saturated such that the voltage V2 state of the second node N2 of the driving transistor DRT represents a characteristic value of the driving transistor DRT will be referred to as an S-mode.

Figure 4:
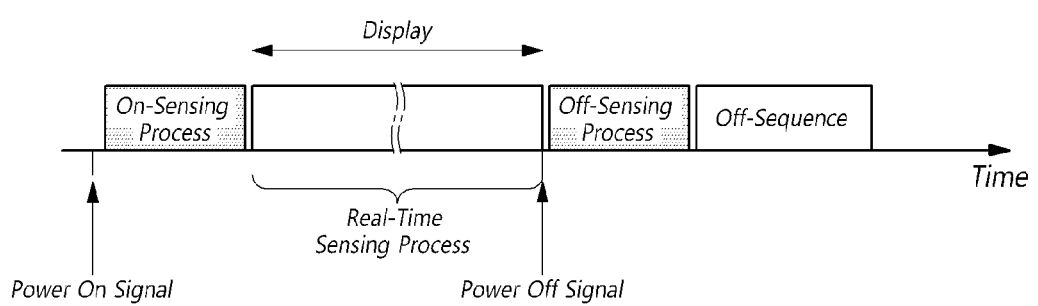
FIG. 4 is a diagram illustrating various sensing timings of a display device according to embodiments of the present disclosure.
Figure 5:
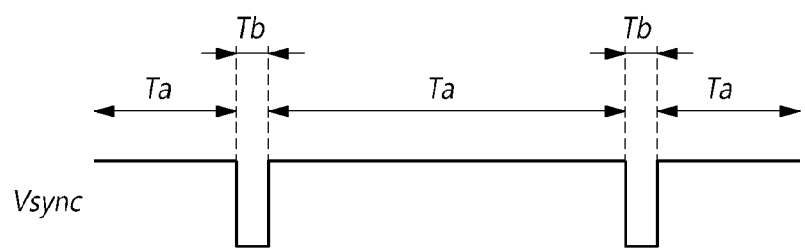
FIG. 5 is a diagram illustrating a vertical synchronization signal of a display device according to embodiments of the present disclosure.

FIG. 4 is a diagram illustrating various sensing timings of the display device 100 according to embodiments of the present disclosure. FIG. 5 is a diagram illustrating a vertical synchronization signal Vsync of the display device 100 according to embodiments of the present disclosure.

Referring to FIG. 4, when a power-on signal is generated, the display device 100 according to embodiments of the present disclosure may sense a characteristic value of a driving transistor DRT inside each subpixel SP disposed in the display panel 110. Such sensing process will be referred to as an "on-sensing process".

In addition, in a case in which a power-off signal is generated, before an off-sequence such as power cutoff progresses, a characteristic value of a driving transistor DRT inside each subpixel SP disposed in the display panel 110 may be sensed as well. Such a sensing process will be referred to as an "off-sensing process".

In addition, before a power off signal is generated after a power-on signal is generated, during display driving, a characteristic value of the driving transistor DRT inside each subpixel SP may be sensed as well. Such a sensing process will be referred to as a "real-time sensing process".

Referring to FIG. 5, the vertical synchronization signal Vsync is a control signal for defining a frame and may repeatedly include a signal section defining an active period Ta and a signal section defining a blank period Tb. The active period Ta may be a period in which substantial display driving for updating a video progresses, and the blank period Tb may be a break period in which substantial display driving does not progress.

For example, the signal section defining the active period Ta may be a high-level voltage section, and the signal section defining the blank period Tb may be a low-level voltage section. As another example, the signal section defining the active period Ta may be a low-level voltage section, and the signal section defining the blank period Tb may be a high-level voltage section.

Referring to FIG. 5, one frame period includes one active period Ta and one blank period Tb.

The real-time sensing process described above may progress for each blank period between active periods Ta with reference to the vertical synchronization signal Vsync.

Figure 6:
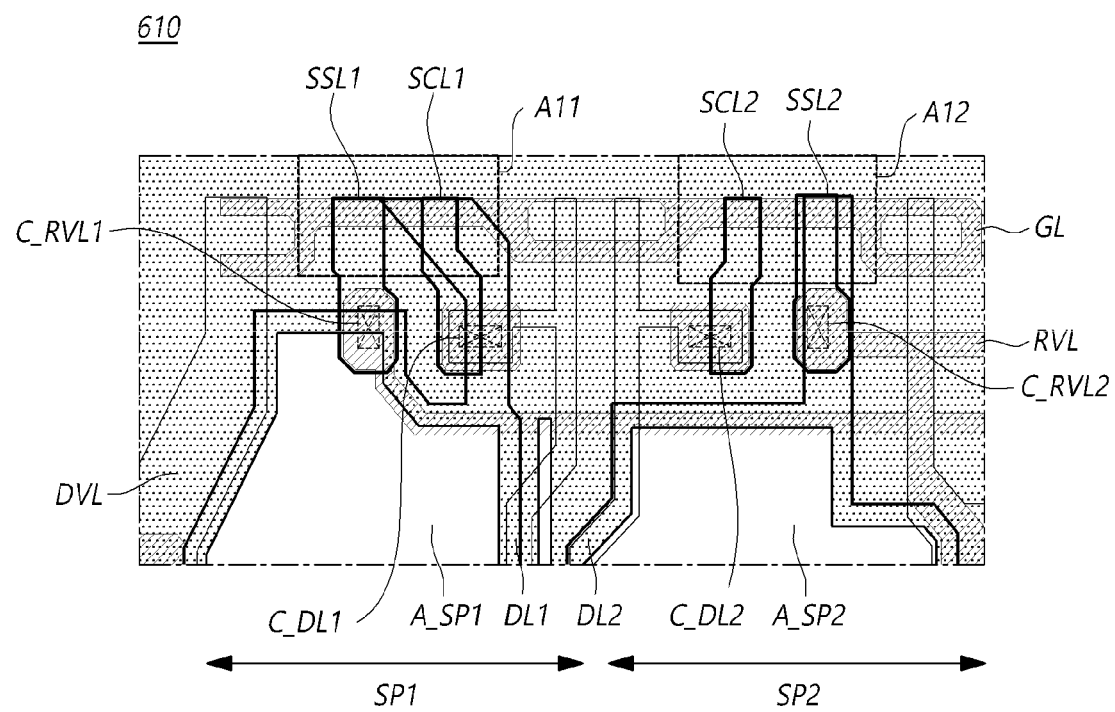
FIGS. 6 and 7 are diagrams for describing a display device, of which an aperture ratio is improved, according to embodiments of the present disclosure.
Figure 7:
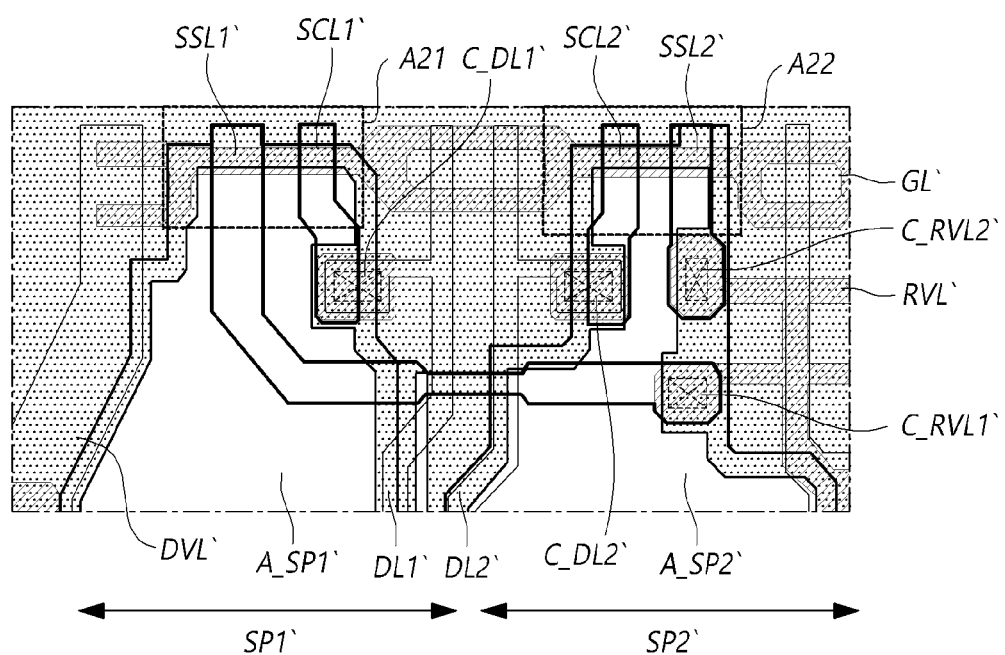

FIGS. 6 and 7 are diagrams for describing a display device 100, of which an aperture ratio is improved, according to embodiments of the present disclosure.

Referring to FIG. 6, a part of a plan view of a first subpixel SP1 and a part of a plan view of a second subpixel SP2 disposed in a display panel 610 can be checked.

The first subpixel SP1 may include a first driving transistor Td1, a first scanning transistor, a first sensing transistor, a first light emitting element E1, and the like.

The first subpixel SP1 illustrated in FIG. 6 may have the same equivalent circuit structure as the subpixel SP illustrated in FIG. 2.

Referring to FIG. 6, in an 11th area A11, the first scanning transistor and the first sensing transistor may be disposed.

The first scanning transistor may be electrically connected to a first data line contact hole C_DL1 through a first scanning connection line SCL1. The first data line contact hole C_DL1 may be electrically connected to a first data line DL1. The first scanning connection line SCL1 is disposed in the non-display region and thus may be formed using a non-transparent material.

The first sensing transistor may be electrically connected to a first reference voltage line contact hole C_RVL1 through a first sensing connection line SSL1. The first reference voltage line contact hole C_RVL1 may be electrically connected to the reference voltage line RVL. The first sensing connection line SSL1 is disposed in the non-display region and thus may be formed using a non-transparent material.

The second subpixel SP2 may include a second driving transistor Td2, a second scanning transistor, a second sensing transistor, a second light emitting element E2, and the like.

The second subpixel SP2 illustrated in FIG. 6 may have the same equivalent circuit structure as the subpixel SP illustrated in FIG. 2.

Referring to FIG. 6, in a 12th area A12, the second scanning transistor and the second sensing transistor may be disposed.

The second scanning transistor may be electrically connected to a second data line contact hole C_DL2 through a second scanning connection line SCL2. The second data line contact hole C_DL2 may be electrically connected to a second data line DL2. The second scanning connection line SCL2 is disposed in the non-display region and thus may be formed using a non-transparent material.

The second sensing transistor may be electrically connected to a second reference voltage line contact hole C_RVL2 through a second sensing connection line SSL2. The second reference voltage line contact hole C_RVL2 may be electrically connected to the reference voltage line RVL. The second sensing connection line SSL2 is disposed in the non-display region and thus may be formed using a non-transparent material.

Referring to FIG. 7, a part of a plan view of a first subpixel SP1' and a part of a plan view of a second subpixel SP2' disposed in a display panel 710 can be checked.

The first subpixel SP1' may include a first driving transistor Td1', a first scanning transistor', a first sensing transistor', a first light emitting element E1', and the like.

The first subpixel SP1' illustrated in FIG. 7 may have the same equivalent circuit structure as the subpixel SP illustrated in FIG. 2.

Referring to FIG. 7, in a 21st area A21, the first scanning transistor' and the first sensing transistor' may be disposed.

The first scanning transistor' may be electrically connected to a first data line contact hole C_DL1' through a first scanning connection line SCL1'. The first data line contact hole C_DL1' may be electrically connected to a first data line DL1'. The first scanning connection line SCL1' may be formed using a transparent material.

The first sensing transistor' may be electrically connected to a first reference voltage line contact hole C_RVL1' through a first sensing connection line SSL1'. The first reference voltage line contact hole C_RVL1' may be electrically connected to the reference voltage line RVL'. The first sensing connection line SSL1' may be formed using a transparent material.

The second subpixel SP2' may include a second driving transistor Td2', a second scanning transistor', a second sensing transistor', a second light emitting element E2, and the like.

The second subpixel SP2' illustrated in FIG. 7 may have the same equivalent circuit structure as the subpixel SP illustrated in FIG. 2.

Referring to FIG. 7, in a 22nd area A22, the second scanning transistor' and the second sensing transistor' may be disposed.

The second scanning transistor' may be electrically connected to a second data line contact hole C_DL2' through a second scanning connection line SCL2'. The second data line contact hole C_DL2' may be electrically connected to a second data line DL2'. The second scanning connection line SCL2' may be formed using a transparent material.

The second sensing transistor' may be electrically connected to a second reference voltage line contact hole C_RVL2' through a second sensing connection line SSL2'. The second reference voltage line contact hole C_RVL2' may be electrically connected to the reference voltage line RVL'. The second sensing connection line SSL2' may be formed using a transparent material.

Referring to FIGS. 6 and 7, there is a difference between aperture ratios of the display panel 610 illustrated in FIG. 6 and the display panel 710 illustrated in FIG. 7.

Referring to FIG. 6, an opening part A_SP1 of the first subpixel SP1 and an opening part A_SP2 of the second subpixel SP2 can be checked. Referring to FIG. 7, an opening part A_SP1' of the first subpixel SP1' and an opening part A_SP2' of the second subpixel SP2' can be checked.

Referring to FIG. 6, the first scanning connection line SCL1, the first sensing connection line SSL1, the second scanning connection line SCL2, and the second sensing connection line SSL2 illustrated in FIG. 6 may be formed using a non-transparent material. On the other hand, referring to FIG. 7, the first scanning connection line SCL1', the first sensing connection line SSL1', the second scanning connection line SCL2', and the second sensing connection line SSL2' illustrated in FIG. 7 may be formed using a transparent material.

The first scanning connection line SCL1', the first sensing connection line SSL1', the second scanning connection line SCL2', and the second sensing connection line SSL2' illustrated in FIG. 7 can be formed using a transparent material, and thus positions at which the first scanning connection line SCL1', the first sensing connection line SSL1', the second scanning connection line SCL2', and the second sensing connection line SSL2' are disposed may be in not the non-display region but in the display region.

In other words, the aperture ratio of the display panel 710 illustrated in FIG. 7 is greater than the aperture ratio of the display panel 610 illustrated in FIG. 6.

On the other hand, a distance between the 21st area A21 and the opening part A_SP1' of the first subpixel SP1' illustrated in FIG. 7 may be shorter than a distance between the 11th area A11 and the opening part A_SP1 of the first subpixel SP1 illustrated in FIG. 6. In accordance with this, a transistor disposed in the 21st area A21 illustrated in FIG. 7 can be easily influenced by light output from the opening part A_SP1' of the first subpixel SP1'.

In addition, a distance with which the 22nd area A22 and the opening part A_SP2' of the second subpixel SP2' illustrated in FIG. 7 may be shorter than a distance with which the 12th area A12 and the opening part A_SP2 of the second subpixel SP2 illustrated in FIG. 6. In accordance with this, a transistor disposed in the 22nd area A22 illustrated in FIG. 7 can be easily influenced by light output from the opening part A_SP2' of the second subpixel SP2'.

In accordance with the transistors disposed in the 21st area A21 and the 22nd area A22 illustrated in FIG. 7 being exposed to light, the characteristic values of the transistors disposed in the 21st area A21 and the 22nd area A22 illustrated in FIG. 7 may change. The changes of the characteristic values of the transistors described above may deteriorate image quality performance of the display device 100.

For this, embodiments of the present disclosure can provide a display device 100 and a driving method capable of sensing changes of characteristics values of sensing transistors SENT.

The embodiments of the present disclosure can provide a display device 100 and a driving method capable of sensing changes in characteristics values of a transistor adjacent to an opening part.

The embodiments of the present disclosure can provide a display device 100 and a driving method capable of implementing low power consumption in accordance with sensing of changes in characteristic values of a transistor adjacent to an opening part. Hereinafter, detailed description will be presented.

Figure 8:
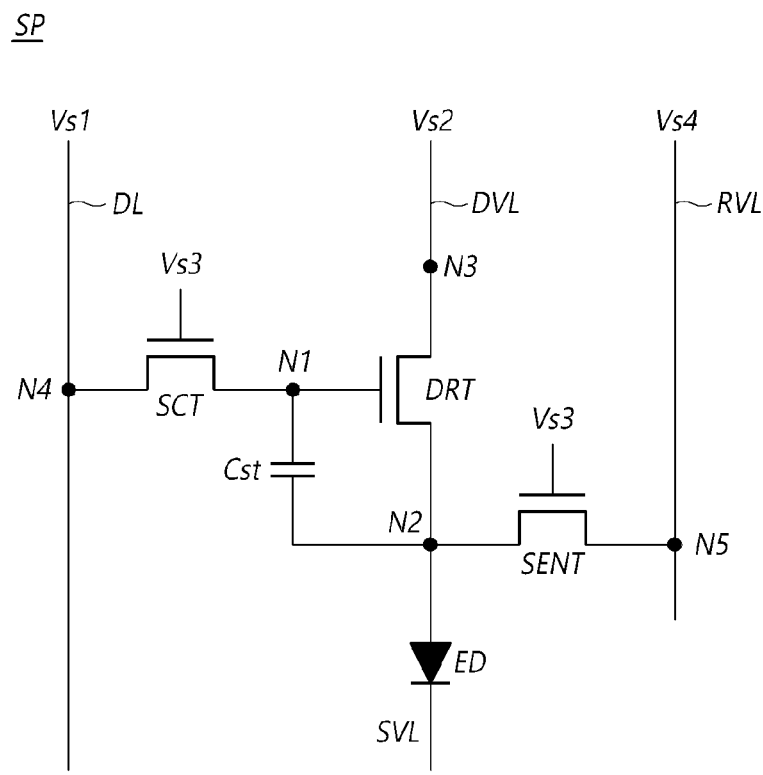
FIG. 8 is an equivalent circuit diagram of a subpixel disposed in a display panel according to embodiments of the present disclosure.

FIG. 8 is an equivalent circuit diagram of a subpixel SP disposed in a display panel 110 according to embodiments of the present disclosure.

The equivalent circuit of the subpixel SP illustrated in FIG. 8 may be the same as the equivalent circuit of the subpixel SP illustrated in FIG. 2. The subpixel SP illustrated in FIG. 8 may be disposed in the display panel 110 illustrated in FIG. 1. In addition, the subpixel SP illustrated in FIG. 8 may disposed also in the display panel 610 illustrated in FIG. 6 and the display panel 710 illustrated in FIG. 7.

Referring to FIG. 8, the subpixel SP may include a light emitting element ED, a driving transistor DRT, a scanning transistor SCT, a sensing transistor SENT, and a storage capacitor Cst.

The driving transistor DRT is a transistor used for driving a light emitting element ED and may include a first node N1, a second node N2, a third node N3, and the like.

The scanning transistor SCT is controlled in accordance with a scanning signal SCAN and may be connected between the first node N1 of the driving transistor DRT and the data line DL. A node at which the drain node of the scanning transistor SCT and the data line DL are electrically connected may be the fourth node N4. In such a case, the scanning transistor SCT may be electrically connected between the first node N1 and the fourth node N4.

The sensing transistor SENT is controlled in accordance with a sensing signal SENSE and may be connected between the second node N2 of the driving transistor DRT and a reference voltage line RVL. A node at which the source node of the sensing transistor SENT and the reference voltage line RVL are electrically connected may be the fifth node N5. In such a case, the sensing transistor SENT may be electrically connected between the second node N2 and the fifth node N5.

The storage capacitor Cst may be electrically connected between the first node N1 and the second node N2.

While the display device 100 is driven, characteristic values of the sensing transistor SENT may change.

In other to compensate for changes of the characteristic values of the sensing transistor SENT, embodiments of the present disclosure may sense characteristic values of the sensing transistor SENT.

In order to sense characteristic values of the sensing transistor SENT, the subpixel SP may be initialized to a predetermined voltage.

In a period in which the subpixel SP is initialized, a first sensing voltage Vs1 may be supplied to the data line DL. The first sensing voltage Vs1 may be supplied for controlling the voltage of the first node N1. The first sensing voltage Vs1 may be a voltage for raising the voltage of the first node N1.

In a period in which the subpixel SP is initialized, a second sensing voltage Vs2 may be supplied to the driving voltage line DVL. The second sensing voltage Vs2 may be supplied for controlling the voltage of the third node N3. The second sensing voltage Vs2 may be a voltage used for setting the drain node of the driving transistor DRT.

In a period in which the subpixel SP is initialized, a third sensing voltage Vs3 may be supplied to the gate node of the scanning transistor SCT and the gate node of the sensing transistor SENT. The third sensing voltage Vs3 may be supplied for controlling a turn-on or turn-off state of the transistor. The third sensing voltage Vs3 may be a voltage used for switching the transistor to a turn-on state or a turn-off state.

In a period in which the subpixel SP is initialized, a fourth sensing voltage Vs4 may be supplied to the reference voltage line RVL. The fourth sensing voltage Vs4 may be supplied for controlling the voltage of the second node N2. The fourth sensing voltage Vs4 may be a voltage used for setting the drain node of the driving transistor DRT.

As described above, after the subpixel SP is initialized, the characteristic values of the sensing transistor SENT may be sensed. A process in which the characteristic values of the sensing transistor SENT are sensed will be described below in detail.

Figure 9:
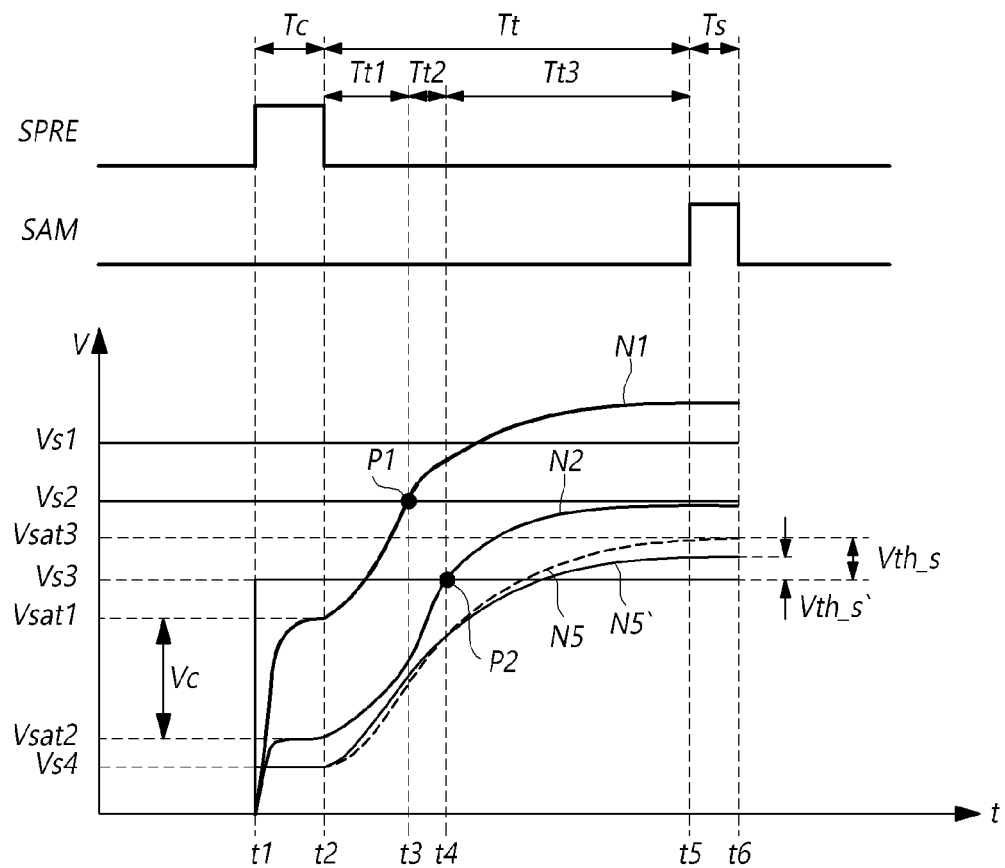
FIG. 9 is a diagram illustrating driving of a display device used for sensing a sensing transistor according to embodiments of the present disclosure.

FIG. 9 is a diagram illustrating driving of the display device 100 used for sensing a sensing transistor SENT according to embodiments of the present disclosure.

A driving period of the display device 100 used for sensing characteristic values of the sensing transistor SENT may include a voltage control period Tc, a voltage tracking period Tt, and a sampling period Ts.

The voltage control period Tc may be a period in which a sensing voltage Vs is supplied for sensing characteristics values of the sensing transistor SENT.

The voltage control period Tc may be a period from a first time point t1 to a second time point t2.

During the voltage control period Tc, a first sensing voltage Vs1 may be supplied to the data line DL.

During the voltage control period Tc, a second sensing voltage Vs2 may be supplied to the driving voltage line DVL.

During the voltage control period Tc, a third sensing voltage Vs3 may be supplied to the gate node of the scanning transistor SCT and the gate node of the sensing transistor SENT. In accordance with supply of the third sensing voltage Vs3, the scanning transistor SCT and the sensing transistor SENT may be switched to a turn-on state.

During the voltage control period Tc, a signal of the turn-on level may be supplied to the power switch SPRE, and a reference voltage Vref may be supplied to the reference voltage line RVL. The reference voltage Vref may be a fourth sensing voltage Vs4.

The third sensing voltage Vs3 may be a voltage used for controlling a turn-on state or a turn-off state of the sensing transistor and the scanning transistor SCT. The first sensing voltage Vs1, the second sensing voltage Vs2, and the fourth sensing voltage Vs4 may be voltages used for maintaining the light emitting element ED to be in a non-emission state during the voltage control period Tc.

In a case in which a voltage higher than the threshold voltage Vth_ED of the light emitting element ED is applied to both ends of the light emitting element ED, the light emitting element ED can emit light. The both-end voltage of the light emitting element ED relates to a voltage supplied to the driving voltage line DVL and a voltage supplied to the ground voltage line SVL. In a case in which the magnitudes of the voltage supplied to the driving voltage line DVL and the voltage supplied to the ground voltage line SVL are decreased, the both-end voltage of the light emitting element ED can be controlled to be lower than the threshold voltage Vth_ED of the light emitting element ED.

A difference between the voltage of the first node N1 that is the gate node of the driving transistor DRT and the voltage of the second node N2 that is the source node of the driving transistor DRT may be called a gate-source voltage Vgs of the driving transistor DRT. In accordance with the magnitude of the gate-source voltage Vgs of the driving transistor DRT, the magnitude of a driving current Ids flowing through the driving transistor DRT may be controlled. In a case in which the driving current Ids flows, the voltage of the second node N2 can be raised. Since the second node N2 is electrically connected to the light emitting element ED, a voltage difference between the second node N2 and the ground voltage line SVL may be larger than the threshold voltage Vth_ED of the light emitting element ED. In order to perform control such that the light emitting element ED is maintained in the non-emission state, magnitudes of the first sensing voltage Vs1 supplied to the first node N1 and the fourth sensing voltage Vs4 supplied to the second node N2 may be controlled.

For example, the second sensing voltage Vs2 supplied to the driving voltage line DVL may be 10 V, and the voltage supplied to the ground voltage line SVL may be 0 V. In addition, the first sensing voltage Vs1 may be 12 V, and the fourth sensing voltage Vs4 may be 0 V. In such a case, the light emitting element ED is maintained to be in the non-emission state. Referring to FIG. 9, in a case in which the first sensing voltage Vs1 is 12 V, and the second sensing voltage Vs2 is 10 V, the first sensing voltage Vs1 may be greater than the second sensing voltage Vs2.

In the case of the example described above, a voltage relation between sensing voltages Vs may be as below. The magnitude of the first sensing voltage Vs1 may be larger than the magnitude of the second sensing voltage Vs2. The magnitude of the second sensing voltage Vs2 may be larger than the magnitude of the third sensing voltage Vs3. The magnitude of the third sensing voltage Vs3 may be larger than the magnitude of the fourth sensing voltage Vs4. In other words, the magnitudes of the first sensing voltage Vs1 to the fourth sensing voltage Vs4 may be compared to have a relationship of "first sensing voltage Vs1>second sensing voltage Vs2>third sensing voltage Vs3>fourth sensing voltage Vs4.

Here, there is no mutual relation of the first sensing voltage Vs1 being higher than the second sensing voltage Vs2. In order to maintain the non-emission state of the light emitting element ED, the first sensing voltage Vs1 may be lower than 12 V, and the first sensing voltage Vs1 may be lower than the second sensing voltage Vs2. In such a case, the magnitude of the second sensing voltage Vs2 may be larger than the magnitude of the third sensing voltage Vs3, and the magnitude of the third sensing voltage Vs3 may be larger than the magnitude of the fourth sensing voltage Vs4. In other words, the magnitudes of the second sensing voltage Vs2 to the fourth sensing voltage Vs4 may be compared to have a relation of "second sensing voltage Vs2>third sensing voltage Vs3>fourth sensing voltage Vs4".

The ranges of the sensing voltages Vs described above are merely examples, and there is no restriction on the ranges of the sensing voltages Vs.

During the voltage control period Tc, in accordance with the third sensing voltage Vs3 being supplied to the gate node of the scanning transistor SCT, the scanning transistor SCT may be switched to the turn-on state. The drain node N4 of the scanning transistor SCT can be electrically connected to the data line DL, and thus, the first sensing voltage Vs1 can be supplied to the drain node N4 of the scanning transistor SCT. In accordance with this, a current can flow through the source node N1 of the scanning transistor SCT, and the voltage of the source node N1 of the scanning transistor SCT can rise.

While the voltage of the source node N1 of the scanning transistor SCT is rising, the sensing transistor SENT may be in the turn-on state. The third sensing voltage Vs3 can be supplied to the gate node of the sensing transistor SENT, and, in accordance therewith, the sensing transistor SENT can be in the turn-on state. Since the sensing transistor SENT is in the turn-on state, and the reference voltage Vref is supplied to the reference voltage line RVL, the reference voltage Vref can be supplied to the second node N2.

While the voltage of the source node N1 of the scanning transistor SCT is rising, the driving transistor DRT can be switched to the turn-on state. The source node N1 of the scanning transistor SCT can be electrically connected to the gate node N1 of the driving transistor DRT. Thus, in a case in which the voltage of the source node N1 of the scanning transistor SCT rises, the voltage of the gate node N1 of the driving transistor DRT rises, and the driving transistor DRT can come into the turn-on state. In accordance with the driving transistor DRT coming into the turn-on state, a current can flow through the source node N2 of the driving transistor DRT. In accordance therewith, the voltage of the second node N2 can rise.

Referring to FIG. 9, it can be checked that the voltage of the first node N1 rises from a first time point t1 and rises till a second time point t2. The voltage of the first node N1 at the second time point t2 can rise to a first saturation voltage Vsat1.

Referring to FIG. 9, it can be checked that the voltage of the second node N2 rises from the first time point t1 and rises till the second time point t2. The voltage of the second node N2 at the second time point t2 can rise to a second saturation voltage Vsat2.

On the other hand, the scanning transistor SCT at the second time point t2 can be switched to the turn-off state. At the second time point t2, the third sensing voltage Vs3 is supplied to the gate node of the scanning transistor SCT, and the voltage of the source node N1 of the scanning transistor SCT can be in a state of rising to the first saturation voltage Vsat1. At the second time point t2, a difference between the voltage of the gate node of the scanning transistor SCT and the voltage of the source node N1 of the scanning transistor SCT may be the same as the threshold voltage Vth_sc of the scanning transistor SCT. In other words, at the second time point t2, the scanning transistor SCT can be switched to the turn-off state.

At the second time point t2, in accordance with the scanning transistor SCT being switched to the turn-off state, a state in which the gate node N1 of the driving transistor DRT and the data line DL are not electrically connected to each other can be formed. In other words, at the second time point t2, the gate node N1 of the driving transistor DRT can come into a floating state. At this time, the storage capacitor Cst can be charged to a charge voltage Vc that is a difference between the first saturation voltage Vsat1 and the second saturation voltage Vsat2. The charge voltage Vc may a gate-source voltage Vgs_d of the driving transistor DRT.

On the other hand, at the second time point t2, a signal of the turn-off level may be supplied to the power switch SPRE, and, in accordance therewith, the reference voltage Vref may not be supplied to the reference voltage line RVL any more.

The voltage tracking period Tt may be a period in which the voltage of the source node N5 of the sensing transistor SENT is tracked. The voltage tracking period Tt may progress after the voltage control period Tc.

The voltage tracking period Tt may be a period in which the voltage of the fifth node N5 that is a connection node electrically connecting the sensing transistor SENT and the reference voltage line RVL to each other is tracked.

The voltage tracking period Tt may include a first tracking period Tt1, a second tracking period Tt2, and a third tracking period Tt3.

The first tracking period Tt1 may be a period from the second time point t2 to the third time point t3.

During the first tracking period Tt1, voltages of the first node N1 and the second node N2 may rise. At this time, a difference between the voltage of the first node N1 and the voltage of the second node N2 can be maintained at the charge voltage Vc. In other words, during the first tracking period Tt1, the voltages of the first node N1 and the second node N2 may rise with the voltage difference of the charge voltage Vc maintained.

During the first tracking period Tt1, the driving transistor DRT may operate in a saturation region. In order to operate in the saturation region, the drain-source voltage Vds of the transistor needs to be higher than the gate-source voltage Vgs of the transistor. In other words, under a condition of "Vds>Vgs", the transistor operates in the saturation region.

The voltage of the drain node of the driving transistor DRT is a driving voltage EVDD, the voltage of the gate node N1 is rising from the first saturation voltage Vsat1, and the voltage of the source node N2 is rising from the second saturation voltage Vsat2. Referring to FIG. 9, during the first tracking period Tt1, it can be checked that the drain-source voltage Vds_d of the driving transistor DRT is higher than the gate-source voltage Vgs_d of the driving transistor DRT. In other words, during the first tracking period Tt1, the driving transistor DRT can operate in the saturation region.

On the other hand, during the first tracking period Tt1, the sensing transistor SENT is in the turn-on state, and the voltage of the drain node N2 of the sensing transistor SENT is rising. Referring to FIG. 9, it can be checked that the voltage of the source node N5 of the sensing transistor SENT rises in accordance therewith.

The second tracking period Tt2 may be a period from the third time point t3 to the fourth time point t4.

During the second tracking period Tt2, the voltages of the first node N1 and the second node N2 may rise with characteristics similar to those of the first tracking period Tt1. In other words, during the second tracking period Tt2, the voltages of the first node N1 and the second node N2 may rise with a voltage difference of the charge voltage Vc maintained.

During the second tracking period Tt2, the driving transistor DRT may operate in a linear region. In order to operate in the linear region, the drain-source voltage Vds of the transistor needs to be lower than the gate-source voltage Vgs of the transistor. In other words, under a condition of "Vds<Vgs", the transistor operates in the linear region.

The voltage of the drain node of the driving transistor DRT is the driving voltage EVDD, the voltage of the gate node N1 is rising from the first saturation voltage Vsat1, and the voltage of the source node N2 is rising from the second saturation voltage Vsat2. Referring to a P1 position illustrated in FIG. 9, it can be checked that the magnitude of the drain-source voltage Vds_d of the driving transistor DRT is the same as the magnitude of the gate-source voltage Vgs_d of the driving transistor DRT are the same at the third time point t3. Then, it can be checked that the magnitude of the drain-source voltage Vds_d of the driving transistor DRT is smaller than the magnitude of the gate-source voltage Vgs_d of the driving transistor DRT after the third time point t3. In other words, during the second tracking period Tt2, the driving transistor DRT can operate in the linear region.

On the other hand, during the second tracking period Tt2, the sensing transistor SENT is in the turn-on state, and the voltage of the drain node N2 of the sensing transistor SENT is rising. Referring to FIG. 9, in accordance therewith, also during the second tracking period Tt2 following the first tracking period Tt1, it can be checked that the voltage of the source node N5 of the sensing transistor SENT is rising.

During the second tracking period Tt2, the sensing transistor SENT can operate in the linear region. This will be described in detail in description of the third tracking period Tt3.

The third tracking period Tt3 may be a period from a fourth time point t4 to a fifth time point t5.

During the third tracking period Tt3, the voltages of the first node N1 and the second node N2 can rise with characteristics similar to those of the first tracking period Tt1. In other words, during the third tracking period Tt3, the voltages of the first node N1 and the second node N2 can rise with a voltage difference of the charge voltage Vc maintained.

Also during the third tracking period Tt3 following the second tracking period Tt2, the driving transistor DRT can operate in the linear region.

During the third tracking period Tt3, the sensing transistor SENT can operate in the saturation region. Referring to FIG. 9, the third sensing voltage Vs3 is supplied to the gate node of the sensing transistor SENT, the voltage of the drain node N2 of the sensing transistor SENT is rising, and the voltage of the source node N5 of the sensing transistor SENT is also rising.

It can be checked that the drain-source voltage Vds_s of the sensing transistor SENT is lower than the gate-source voltage Vgs_s of the sensing transistor SENT before the fourth time point t4. In other words, before the fourth time point t4, the sensing transistor SENT can operate in the linear region.

However, it can be checked that the drain-source voltage Vds_s of the sensing transistor SENT is higher than the gate-source voltage Vgs_s of the sensing transistor SENT after the fourth time point t4. In other words, after the fourth time point t4, the sensing transistor SENT can operate in the saturation region.

In other words, during the third tracking period Tt3, the sensing transistor SENT can operate in the saturation region. In accordance with the sensing transistor SENT operating in the saturation region, the sensing transistor SENT can be driven as a source follower type.

During the third tracking period Tt3, since the sensing transistor SENT can be driven as the source follower type, the voltage of the source node N5 of the sensing transistor SENT can be saturated with a voltage level of a predetermined saturation voltage Vsat3.

The saturation voltage Vsat3 described above may be a voltage that is greater than the third sensing voltage Vs3 by the threshold voltage Vth_s of the sensing transistor SENT. In other words, the saturation voltage Vsat3 may be "Vsat3=Vs3−Vth_s". For example, when the third sensing voltage Vs3 a gate high voltage VGH that is a gate signal of a turn-on level, the saturation voltage Vsat3 can rise to "VGH−Vth_s".

At this time, the gate-source voltage Vgs_s of the sensing transistor SENT can be the same as the threshold voltage Vth_s of the sensing transistor SENT, and thus the sensing transistor SENT can be switched to the turn-off state.

The sampling period Ts may be a period in which the voltage of the source node N5 of the sensing transistor SENT is sensed. The sampling period Ts may progress after the voltage tracking period Tt.

During the sampling period Ts, a signal of the turn-on level may be supplied to the sampling switch SPRE. In accordance therewith, the voltage of the source node N5 of the sensing transistor SENT may be sensed by a sampling circuit (not illustrated). Since the sampling circuit (not illustrated) can be included in the data driving circuit 120, the data driving circuit 120 can sense a sensing voltage Vsen that is the voltage of the source node N5 of the sensing transistor SENT. The saturation voltage Vsat3 that is the sensing voltage Vsen may be greater than the third sensing voltage Vs3 by the threshold voltage Vth_s of the sensing transistor SENT.

The data driving circuit 120 may include an analog digital converter ADC, and the data driving circuit 120 may convert a sensing voltage Vsen that is an analog voltage into sensing data Data_sen that is a digital form. Thereafter, the data driving circuit 120 may transmit the sensing data Data_sen to the controller 140.

After receiving transmission of the sensing data Data_sen, the controller 140 may determine a degree of negative shift of the threshold voltage Vth_s of the sensing transistor SENT.

The threshold voltage Vth_s of the sensing transistor SENT being negatively shifted may represent that the threshold voltage Vth_s of the sensing transistor SENT during the voltage control period Tc has a voltage value that is lower than a threshold voltage Vth_s" of the sensing transistor SENT during a threshold voltage sensing period before the voltage control period Tc. For example, the threshold voltage sensing period before the voltage control period Tc may be an "on-sensing process" that progresses when power of the display device 100, to which power is being currently supplied, is turned on or an "off-sensing process" that progresses before power is supplied to the display device 100 to which power is being currently supplied.

The saturation voltage Vsat3 can be acquired through sensing data Data_sen, and the saturation voltage Vsat3 may be a voltage that is greater than the third sensing voltage Vs3 by the threshold voltage Vth_s of the sensing transistor SENT. In other words, the saturation voltage Vsat3 may be "Vsat3=Vs3−Vth_s".

On the other hand, before threshold voltage shift occurs, the threshold voltage Vth_s' of the sensing transistor SENT may be sensed and stored in the display device 100. In other words, through a calculated value acquired by subtracting the threshold voltage Vth_s' of the sensing transistor SENT before occurrence of threshold voltage shift from the third sensing voltage Vs3 and then subtracting the saturation voltage Vsat3 therefrom, a degree of negative shift of the threshold voltage can be determined. The calculated value described above may be "Vs3+Vth_s−Vs3−Vth_s'".

For example, when it is assumed that threshold voltage shift does not occur, the calculated value may be 0. As another example, when it is assumed that negative shift occurs, the calculated value is derived as a negative shift value of the threshold voltage other than 0.

In other words, the controller 140 can derive a negative shift value of the threshold voltage and thereafter can compensate for the threshold voltage Vth_s of the sensing transistor SENT. The compensation process will be additionally described with reference to FIG. 10.

Figure 10:
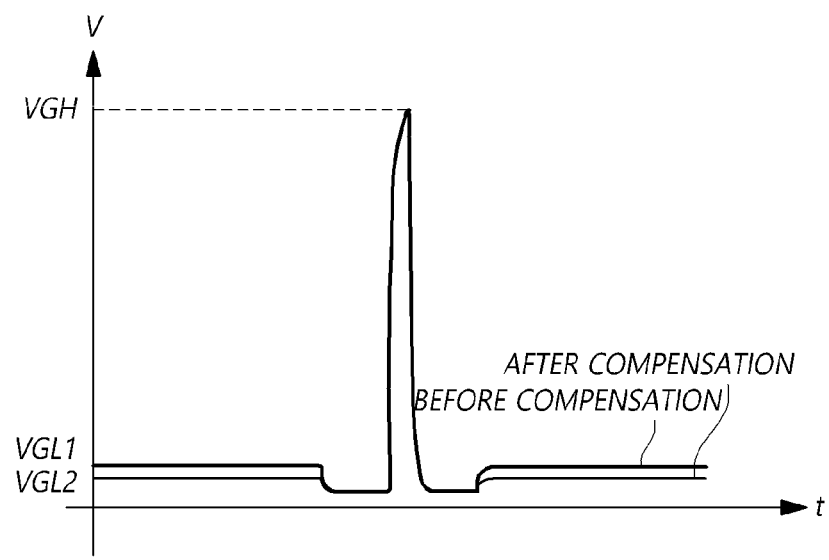
FIGS. 10 and 11 are graphs relating to a voltage used for compensating for a threshold voltage of a sensing transistor according to embodiments of the present disclosure.

FIG. 10 is a diagram relating to a voltage supplied to the gate node of the sensing transistor SENT according to embodiments of the present disclosure.

Referring to FIG. 10, a gate high voltage VGH and gate low voltages VGL1, VGL2 that are voltages supplied to the gate node of the sensing transistor SENT can be checked.

Referring to FIG. 10, a first gate low voltage VGL1 may be a voltage supplied to the gate node of the sensing transistor SENT before compensation.

In a case in which the controller 140 determines that the threshold voltage Vth_s of the sensing transistor SENT has been negatively shifted, the gate low voltage VGL may be adjusted to be further lowered and supplied to the gate node of the sensing transistor SENT. For example, referring to FIG. 10, although the first gate low voltage VGL1 is supplied to the gate node of the sensing transistor SENT before compensation, a second gate low voltage VGL2 may be supplied to the gate node of the sensing transistor SENT. In accordance therewith, the threshold voltage Vth_s of the sensing transistor SENT can be compensated.

Figure 11:
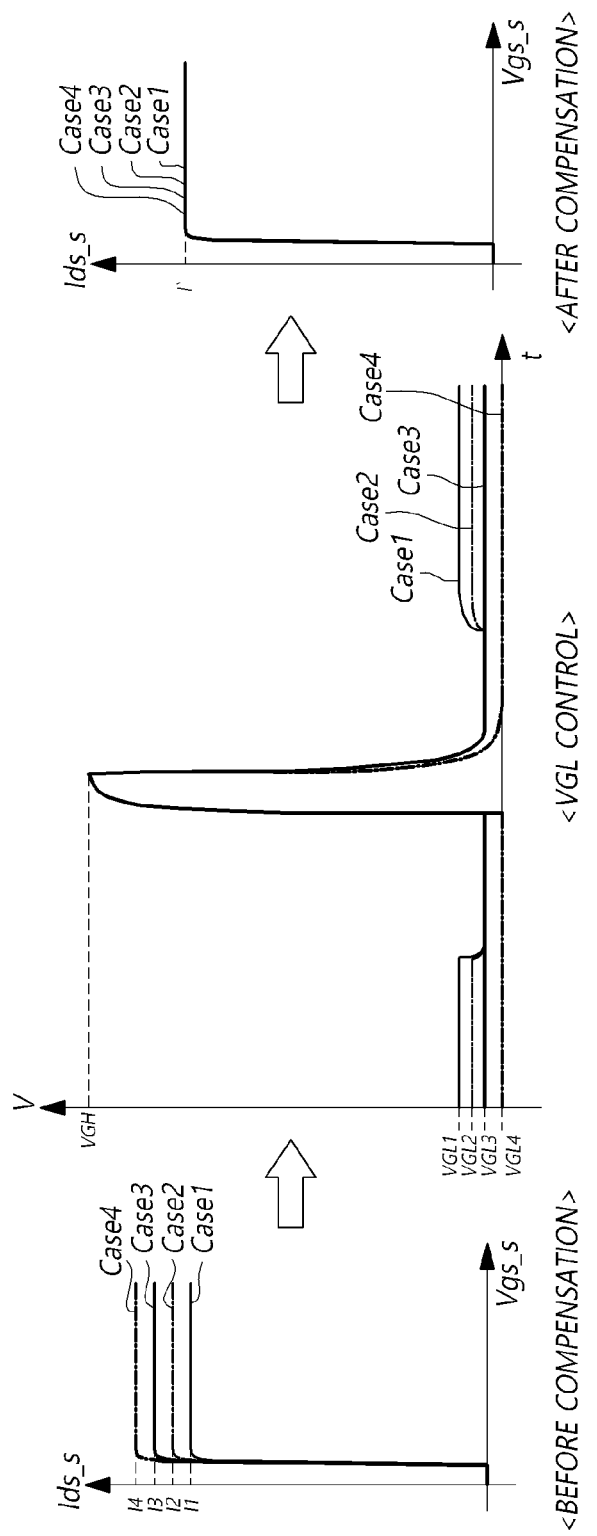

FIG. 11 is a graph relating to a voltage used for compensating for the threshold voltage Vth_s of the sensing transistor SENT according to embodiments of the present disclosure.

While the display device 100 is driven, the threshold voltage Vth_s of the sensing transistor SENT may vary.

The threshold voltage Vth_s of the sensing transistor SENT may variously vary in accordance with a time in which the display device 100 is driven. Referring to "<Before compensation>" illustrated in FIG. 11, before the threshold voltage Vth_s of the sensing transistor SENT is compensated, four cases in which threshold voltages Vth_s of the sensing transistor SENT are different from each other can be checked.

A first case (Case 1) is a case in which the threshold voltage Vth_s of the sensing transistor SENT has not been negatively shifted. For example, the threshold voltage Vth_s may be 0 [V].

A second case (Case 2) is a case in which the threshold voltage Vth_s of the sensing transistor SENT has been weakly negatively shifted. For example, the threshold voltage Vth_s may be −1 [V].

A third case (Case 3) is a case in which the threshold voltage Vth_s of the sensing transistor SENT has been intermediately negatively shifted. For example, the threshold voltage Vth_s may be −2 [V].

A fourth case (Case 4) is a case in which the threshold voltage Vth_s of the sensing transistor SENT has been strongly negatively shifted. For example, the threshold voltage Vth_s may be −3 [V].

Referring to FIG. 11, in the first case (Case 1) to the fourth case (Case 4), the same gate-source voltage Vgs_s of the sensing transistor SENT may be applied to the gate node of the sensing transistor SENT. At this time, a current flowing through the sensing transistor SENT may flow. A first current I1 flows through the sensing transistor SENT of the first case (Case 1), a second current I2 flows through the sensing transistor SENT of the second case (Case 2), a third current I3 flows through the sensing transistor SENT of the third case (Case 3), and a fourth current I4 flows through the sensing transistor SENT of the fourth case (Case 4). The order of the magnitudes of the first current I1 to the fourth current I4 described above may be "I1<I2<I3<I4".

In other words, although the same gate-source voltage Vgs_s of the sensing transistor SENT is applied to the gate node of the sensing transistor SENT, the sensing transistor SENT may not be normally controlled. Thus, the threshold voltage Vth_s of the sensing transistor SENT needs to be compensated.

Referring to FIG. 11, in accordance with control of the voltage level of the gate low voltage VGL supplied to the gate node of the sensing transistor SENT, the threshold voltage Vth_s of the sensing transistor SENT can be compensated.

The first case (Case 1) is a case in which the threshold voltage Vth_s of the sensing transistor SENT has not been negatively shifted, and thus the first gate low voltage VGL1 can be supplied without being changed.

The second case (Case 2) is a case in which the threshold voltage Vth_s of the sensing transistor SENT has been weakly negatively shifted, and thus the first gate low voltage VGL1 can be changed to the second gate low voltage VGL2 and supplied.

The third case (Case 3) is a case in which the threshold voltage Vth_s of the sensing transistor SENT has been intermediately negatively shifted, and thus the first gate low voltage VGL1 can be changed to the third gate low voltage VGL3 and supplied.

The fourth case (Case 4) is a case in which the threshold voltage Vth_s of the sensing transistor SENT has been strongly negatively shifted, and thus the first gate low voltage VGL1 can be changed to the fourth gate low voltage VGL4 and supplied.

Referring to FIG. 11, in accordance with control of the voltage level of the gate low voltage VGL supplied to the gate node of the sensing transistor SENT, the threshold voltage Vth_s of the sensing transistor SENT can be compensated.

For example, a first sensing transistor SENT1 can receive supply of a first gate low voltage VGL1, and a second sensing transistor SENT2 other than the first sensing transistor can receive supply of a second gate low voltage VGL2 different from the first gate low voltage VGL1.

Referring to "<After compensation>" illustrated in FIG. 11, after the threshold voltage Vth_s of the sensing transistor SENT is compensated, when the same gate-source voltage Vgs_s of the sensing transistor SENT is applied to the gate node of the sensing transistor SENT, it can be checked that the same current I' flows in the sensing transistors SENT of the first case (Case 1) to the fourth case (Case 4).

In other words, embodiments of the present disclosure can provide a display device 100 and a driving method capable of sensing changes of characteristics values of sensing transistors SENT.

The embodiments of the present disclosure can provide a display device 100 and a driving method capable of sensing changes in characteristics values of a transistor adjacent to an opening part.

The embodiments of the present disclosure can provide a display device 100 and a driving method capable of implementing low power consumption in accordance with sensing of changes in characteristic values of a transistor adjacent to an opening part.

On the other hand, referring to FIG. 7, the first scanning transistor' and the first sensing transistor' may be disposed in the 21st area A21, and the second scanning transistor' and the second sensing transistor' may be disposed in the 22nd area A22.

The threshold voltages Vth_s of the first sensing transistor' and the second sensing transistor' may be compensated using the method described above.

Referring to FIG. 7, in the 21st area A21, the first scanning transistor' may be disposed on the same line as the first sensing transistor'. In accordance with disposition on the same line, a degree of negative shift of the threshold voltage Vth of the first sensing transistor' and a degree of negative shift of the threshold voltage Vth of the first scanning transistor' can be configured to be the same. In other words, on the basis of threshold voltage Vth information of the first sensing transistor', the threshold voltage Vth of the first scanning transistor' can be compensated.

Referring to FIG. 7, in the 22nd area A22, the second scanning transistor' may be disposed on the same line as the second sensing transistor'. In accordance with disposition on the same line, a degree of negative shift of the threshold voltage Vth of the second sensing transistor' and a degree of negative shift of the threshold voltage Vth of the second scanning transistor' can be configured to be the same. In other words, on the basis of threshold voltage Vth information of the second sensing transistor', the threshold voltage Vth of the second scanning transistor' can be compensated.

Figure 12:
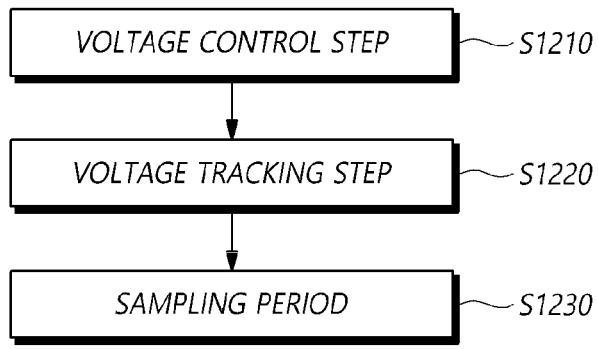
FIGS. 12 and 13 are flowcharts of a method for driving a display device used for sensing a sensing transistor according to embodiments of the present disclosure.
Figure 13:
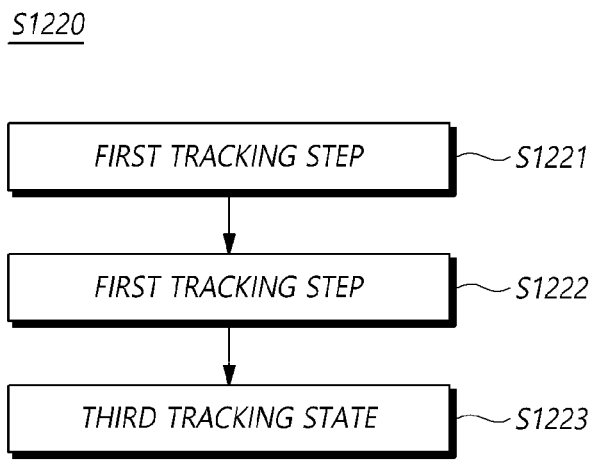

FIGS. 12 and 13 are flowcharts of a method for driving the display device 100 for sensing the sensing transistor SENT according to embodiments of the present disclosure.

The method for driving the display device 100 for sensing the sensing transistor SENT may include a voltage control step S1210, a voltage tracking step S1220, and a sampling step S1230.

The voltage control step S1210 may be a step in which a sensing voltage Vs is supplied for sensing characteristic values of the sensing transistor SENT.

In the voltage control step S1210, the first sensing voltage Vs1 may be supplied to the data line DL.

In the voltage control step S1210, the second sensing voltage Vs2 may be supplied to the driving voltage line DVL.

In the voltage control step S1210, the third sensing voltage Vs3 may be supplied to the gate node of the scanning transistor SCT and the gate node of the sensing transistor SENT. In accordance with supply of the third sensing voltage Vs3, the scanning transistor SCT and the sensing transistor SENT can be switched to the turn-on state.

In the voltage control step S1210, by supplying a signal of the turn-on level to the power switch SPRE, the reference voltage Vref can be supplied to the reference voltage line RVL. The reference voltage Vref may be the fourth sensing voltage Vs4.

The voltage tracking step S1220 may be a step in which the voltage of the source node N5 of the sensing transistor SENT is tracked.

In the voltage tracking step S1220, the voltages of the first node N1 and the second node N2 can rise with a voltage difference of the charge voltage Vc maintained.

Referring to FIG. 13, the voltage tracking step S1220 may include a first tracking step S1221, a second tracking step S1222, and a third tracking step S1223.

The first tracking step S1221 may be a step in which the driving transistor DRT operates in the saturation region.

The second tracking step S1222 may be a step in which the driving transistor DRT operates in the linear region, and the sensing transistor SENT operates in the linear region.

The third tracking step S1223 may be a step in which the sensing transistor SENT operates in the saturation region. In accordance with the sensing transistor SENT operating in the saturation region, the sensing transistor SENT can be driven as a source follower type.

In the third tracking step S1223, the sensing transistor SENT can be driven as the source follower type, and thus the voltage of the source node N5 of the sensing transistor SENT can be saturated with a voltage level of a predetermined saturation voltage Vsat3.

The sampling step S1230 may be a step in which the voltage of the source node N5 of the sensing transistor SENT is sensed.

In the sampling step S1230, a signal of the turn-on level may be supplied to the sampling switch SPRE. In accordance therewith, the voltage of the source node N5 of the sensing transistor SENT can be sensed using a sampling circuit not illustrated. The sampling circuit not illustrated can be included in the data driving circuit 120, and thus the data driving circuit 120 can sense a sensing voltage Vsen that is the voltage of the source node N5 of the sensing transistor SENT.

The embodiments of the present disclosure described above can provide a display device 100 and a driving method capable of sensing changes of characteristics values of sensing transistors SENT.

The embodiments of the present disclosure can provide a display device 100 and a driving method capable of sensing changes in characteristics values of a transistor adjacent to an opening part.

The embodiments of the present disclosure can provide a display device 100 and a driving method capable of implementing low power consumption in accordance with sensing of changes in characteristic values of a transistor adjacent to an opening part. Hereinafter, description will be presented in detail.

The embodiments of the present disclosure described above will be briefly described as below.

Embodiments of the present disclosure can provide a display device including: a driving transistor for driving a light emitting element; a scanning transistor electrically connected between a first node that is a gate node of the driving transistor and a data line; and a sensing transistor electrically connected between a second node of the driving transistor and a reference voltage line, in which a period driven for sensing characteristic values of the sensing transistor includes a voltage control period, a voltage tracking period, and a sampling period, and, during the voltage control period, a first sensing voltage is supplied to the data line, a second sensing voltage is supplied to a third node of the driving transistor, a third sensing voltage is supplied to a gate node of the scanning transistor and a gate node of the sensing transistor, and a fourth sensing voltage is supplied to the reference voltage line.

The second sensing voltage may be higher than the third sensing voltage, and the third sensing voltage may be higher than the fourth sensing voltage.

The voltage tracking period may be a period in which a voltage of a connection node to which the sensing transistor and the reference voltage line are electrically connected is tracked, and the voltage tracking period may progress after the voltage control period.

The scanning transistor may be in a turn-off state during the voltage tracking period.

A voltage difference between the first node and the second node may be maintained during the voltage tracking period.

The voltage tracking period may include a first tracking period, a second tracking period, and a third tracking period.

A voltage difference between the third node and the second node may be larger than the voltage difference between the first node and the second node during the first tracking period.

A voltage difference between the third node and the second node may be less than the voltage difference between the first node and the second node during the second tracking period.

During the third tracking period, a voltage difference between the second node and the connection node may be larger than a voltage difference between the gate node of the sensing transistor and the connection node.

The sampling period may be a period in which a voltage of a source node of the sensing transistor is sensed, and the sampling period may progress after the voltage tracking period.

A data driving circuit supplying the first sensing voltage to the data line may be further included, and the data driving circuit may include: an analog-to-digital converter for sensing a voltage of the reference voltage line; a sampling switch controlling connection between the reference voltage line and the analog-to-digital converter; and an initialization switch controlling connection between the reference voltage line and a reference voltage supply node to which a reference voltage is supplied.

A first sensing transistor that is the sensing transistor may receive supply of a first gate low voltage, and a second sensing transistor other than the first sensing transistor may receive supply of a second gate low voltage different from the first gate low voltage.

A threshold voltage of the sensing transistor during the voltage control period may have a voltage value lower than a threshold voltage of the sensing transistor during a threshold voltage sensing period that is before the voltage control period.

The sensing transistor and the reference voltage line may be electrically connected to each other through a transparent wiring.

The sensing transistor may be disposed adjacent to an opening part through which light is output from the light emitting element. In addition, in the first tracking period, the driving transistor may operate in the saturation region, in the second tracking period, the driving transistor may operate in the linear region and the sensing transistor may operate in the linear region, and in the third tracking period, the driving transistor may operate in the linear region and the sensing transistor may operate in the saturation region. Also, in the third tracking period, the sensing transistor may be driven as a source follower type.

A driving method for a display device, the driving method including: controlling a voltage supplied to a subpixel including a driving transistor, a scanning transistor, and a sensing transistor; tracking a voltage of a source node of the sensing transistor; and sensing the voltage of the source node of the sensing transistor, in which, in the tracking of a voltage, a first sensing voltage is supplied to a drain node of the scanning transistor, a second sensing voltage is supplied to a drain node of the driving transistor, a third sensing voltage is supplied to a gate node of the scanning transistor and a gate node of the sensing transistor, and a fourth sensing voltage is supplied to the source node of the sensing transistor.

In the controlling of a voltage, the second sensing voltage may be higher than the third sensing voltage, and the third sensing voltage may be higher than the fourth sensing voltage.

In the tracking of a voltage, a drain-source voltage of the sensing transistor may be higher than a gate-source voltage of the sensing transistor.

After the sensing of the voltage, a first sensing transistor that is the sensing transistor may receive supply of a first gate low voltage, and a second sensing transistor other than the first sensing transistor may receive supply of a second gate low voltage that is different from the first gate low voltage.

A threshold voltage of the sensing transistor in the controlling of a voltage may be negatively shifted.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention.

REFERENCE SIGNS LIST

100: Display device
110: Display panel
120: Data driving circuit
130: Gate driving circuit
140: Controller

What is claimed is:
1. A display device comprising:
a light emitting element configured to emit light;
a driving transistor including a gate electrode at a first node, a first electrode connected to a third node, and a second electrode connected to the light emitting element at a second node, the driving transistor configured to drive the light emitting element;

a scanning transistor electrically connected between the gate electrode of the driving transistor at the first node and a data line, the scanning transistor including a gate electrode; and a sensing transistor electrically connected between the second electrode of the driving transistor at the second node and a reference voltage line, the sensing transistor including a gate electrode;

wherein a period during which a characteristic value of the sensing transistor is sensed includes a voltage control period, a voltage tracking period after the voltage control period, and a sampling period after the voltage tracking period, and during the voltage control period, a first sensing voltage is supplied to the data line, a second sensing voltage is supplied to the first electrode of the driving transistor at the third node, a third sensing voltage is supplied to the gate electrode of the scanning transistor and the gate electrode of the sensing transistor, and a fourth sensing voltage is supplied to the reference voltage line, wherein the voltage tracking period includes a first tracking period, a second tracking period after the first tracking period, and a third tracking period after the second tracking period.

2. The display device according to claim 1, wherein the second sensing voltage is greater than the third sensing voltage, and the third sensing voltage is greater than the fourth sensing voltage.

3. The display device according to claim 1, wherein the scanning transistor is off during the voltage tracking period.

4. The display device according to claim 1, wherein a voltage difference between the third node and the second node is greater than a difference between the first node and the second node during the first tracking period.

5. The display device according to claim 1, wherein a voltage difference between the third node and the second node is less than a voltage difference between the first node and the second node during the second tracking period.

6. The display device according to claim 1, wherein a voltage difference between the second node and a connection node is greater than a voltage difference between the gate electrode of the sensing transistor and the connection node during the third tracking period.

7. The display device according to claim 1, wherein a first sensing transistor receives a first gate low voltage, the first sensing transistor being the sensing transistor, and a second sensing transistor that is different from the first sensing transistor receives a second gate low voltage that is different from the first gate low voltage.

8. The display device according to claim 1, wherein a threshold voltage of the sensing transistor during the voltage control period has a voltage value that is lower than a threshold voltage of the sensing transistor during a threshold voltage sensing period that is prior to the voltage control period.

9. The display device according to claim 1, further comprising:

a transparent wiring that electrically connects the sensing transistor and the reference voltage line.

10. The display device according to claim 1, wherein the sensing transistor is adjacent to an opening through which light is output from the light emitting element.

11. The display device according to claim 1, wherein the driving transistor operates in a saturation region during the first tracking period, the driving transistor operates in a linear region and the sensing transistor operates in the linear region during the second tracking period, and the driving transistor operates in the linear region and the sensing transistor operates in the saturation region during the third tracking period.

12. The display device according to claim 1, wherein the sensing transistor is driven as a source follower type during the third tracking period.

13. A driving method for a display device, the driving method comprising:

controlling a voltage supplied to a subpixel, the subpixel including:

a light emitting element configured to emit light;

a driving transistor including a gate electrode at a first node, a drain electrode connected to a third node, and a source electrode connected to the light emitting element at a second node, the driving transistor configured to drive the light emitting element;

a scanning transistor electrically connected between the gate electrode of the driving transistor at the first node and a data line, the scanning transistor including a gate electrode, a drain electrode, and a source electrode; and a sensing transistor electrically connected between the source electrode of the driving transistor at the second node and a reference voltage line, the sensing transistor including a gate electrode, a drain electrode, and a source electrode;

tracking a voltage of the source electrode of the sensing transistor; and sensing the voltage of the source electrode of the sensing transistor, wherein, during the tracking of the voltage of the source electrode of the sensing transistor, a first sensing voltage is supplied to the drain electrode of the scanning transistor, a second sensing voltage is supplied to the drain electrode of the driving transistor, a third sensing voltage is supplied to the gate electrode of the scanning transistor and the gate electrode of the sensing transistor, and a fourth sensing voltage is supplied to the source electrode of the sensing transistor, wherein a period of the tracking of the voltage of the source electrode of the sensing transistor includes a first tracking period, a second tracking period after the first tracking period, and a third tracking period after the second tracking period.

14. A display device comprising:

a light emitting element configured to emit light;

a driving transistor including a gate electrode at a first node, a first electrode connected to a third node, and a second electrode connected to the light emitting element at a second node, the driving transistor configured to drive the light emitting element;

a scanning transistor electrically connected between the gate electrode of the driving transistor at the first node and a data line, the scanning transistor including a gate electrode; and a sensing transistor electrically connected between the second electrode of the driving transistor at the second node and a reference voltage line, the sensing transistor including a gate electrode, wherein a sensing characteristic of the sensing transistor is sensed during a sensing mode and a voltage of a source electrode or a drain electrode of the sensing transistor is adjusted from a first voltage applied during the sensing mode to a second voltage that is less than the first voltage based on the sensing characteristic of the sensing transistor, wherein a voltage tracking period of the source electrode of the sensing transistor includes a first tracking period, a second tracking period after the first tracking period, and a third tracking period after the second tracking period.

15. The display device of claim 14, wherein a scan signal includes a gate high voltage and a gate low voltage that is less than the gate high voltage, and the first voltage is a first voltage level of the gate low voltage and the second voltage is a second voltage level of the gate low voltage that is less than the first voltage level.

16. The display device of claim 14, wherein the sensing characteristic of the sensing transistor is a threshold voltage of the sensing transistor.

17. The display device of claim 14, wherein the sensing mode comprises a voltage control period, the voltage tracking period after the voltage control period, and a sampling period after the voltage tracking period, and during the voltage control period, a first sensing voltage is supplied to the data line, a second sensing voltage is supplied to the first electrode of the driving transistor at the third node, a third sensing voltage is supplied to the gate electrode of the scanning transistor and the gate electrode of the sensing transistor based on the first voltage, and a fourth sensing voltage is supplied to the reference voltage line,
wherein the second sensing voltage is greater than the third sensing voltage, and the third sensing voltage is greater than the fourth sensing voltage.

18. The display device of claim 17, wherein the voltage tracking period is a period during which the scanning transistor is off and a voltage at a connection node is tracked, the sensing transistor and the reference voltage line are electrically connected at the connection node.

19. The display device according to claim 18, wherein a voltage difference between the first node and the second node is maintained during the voltage tracking period,
wherein a voltage difference between the third node and the second node is greater than a voltage difference between the first node and the second node during the first tracking period, a voltage difference between the third node and the second node is less than a voltage difference between the first node and the second node during the second tracking period, and a voltage difference between the second electrode and the connection node is greater than a voltage difference between the gate electrode of the sensing transistor and the connection node during the third tracking period.

* * * * *